(12) United States Patent
Sun et al.

(10) Patent No.: US 10,908,203 B2
(45) Date of Patent: Feb. 2, 2021

(54) SIMULTANEOUS FAULT DETECTION AND LOCATION OF POWER DISTRIBUTION SYSTEMS

(71) Applicants: Mitsubishi Electric Research Laboratories, Inc., Cambridge, MA (US); Mitsubishi Electric Corporation, Tokyo (JP)

(72) Inventors: Hongbo Sun, Lexington, MA (US); Vanja Svenda, Medford, MA (US); Tomihiro Takano, Tokyo (JP)

(73) Assignees: Mitsubishi Electric Research Laboratories, Inc., Cambridge, MA (US); Mitsubishi Electric Corporation, Tokyo (JP)

( * ) Notice: Subject to any disclaimer, the term of this patent is extended or adjusted under 35 U.S.C. 154(b) by 97 days.

(21) Appl. No.: 16/379,152

(22) Filed: Apr. 9, 2019

(65) Prior Publication Data
US 2020/0326363 A1  Oct. 15, 2020

(51) Int. Cl.
*G01R 31/08* (2020.01)
*H02H 7/22* (2006.01)
*H02H 1/00* (2006.01)

(52) U.S. Cl.
CPC .......... *G01R 31/086* (2013.01); *H02H 1/0007* (2013.01); *H02H 1/0092* (2013.01); *H02H 7/22* (2013.01)

(58) Field of Classification Search
CPC ........ H02J 7/00; H02J 7/0014; H02J 7/00034; H02J 7/00036; H02J 7/00038; H02J 7/00045; H02J 7/0013; H02J 7/0031; H02J 7/0042; H02J 7/0049; H02J 7/0068; H02J 7/345; H02J 7/0026; H02J 7/0045; H02J 7/0047; H02J 7/007; H02J 13/0013; H02J 2007/0067; H02J 3/00; H02H 1/0007; H02H 1/0092; H02H 7/22; H02H 7/261;
(Continued)

(56) References Cited

U.S. PATENT DOCUMENTS

2015/0309089 A1* 10/2015 Katsukura ........ G01R 19/16547
324/511

* cited by examiner

*Primary Examiner* — Bryan R Perez
(74) *Attorney, Agent, or Firm* — Gennadiy Vinokur; James McAleenan; Hinori Tsukamoto

(57) ABSTRACT

Systems and methods are configured for detecting and locating simultaneous faults in a distribution network having primary and secondary buses connected with two-terminal sections. The measured three-phase voltages and currents from the primary buses are received via a communication network, and the series impedances and shunt admittances and the pre-fault connectivity topology are retrieved from the storage. Simultaneous faults are determined to occur by verifying at least one phase of at least three buses having phase current mismatches determined as the differences between the measured values and calculated values using normal topology and phase voltages that are greater than a threshold. A location for each fault is determined individually if the faults are occurring at non-adjacent sections in the distribution network, or jointly if the faults are occurring at adjacent sections in the distribution network. Faulted line sections are isolated by activating switching operations for connected switches to the faulted line sections that communicatively linked to distribution system grid via communication network.

20 Claims, 22 Drawing Sheets

(58) Field of Classification Search
CPC ........... H02H 7/262–263; H02H 3/165; H02H 3/006; G01R 31/086
See application file for complete search history.

SIMULTANEOUS FAULT DETECTION AND LOCATION OF POWER DISTRIBUTION SYSTEMS

FIELD OF THE INVENTION

The present disclosure relates generally to electric power systems, and more particularly to simultaneous fault detection and location of power distribution systems.

BACKGROUND OF THE INVENTION

As energy consumers keep on increasing their demands and further upgrading of existing equipment is always limited, electric utilities are forced to make the most out of the existing power systems. One of the main goals expected from the consumers is to have an electric power system with continuous supply of energy, higher reliability and minimal outages. To tackle this, utilities look to decrease the number of faults in a system or, more realistically, be able to detect and locate them as fast as possible. By doing so, customer outage times and economic loss are reduced, reliability is improved and thus makes maintenance and operation easier.

Fault detection and location is more complex in distribution systems than transmission systems, due to a huge number of feeders and laterals, less available measurement, the networks being unbalanced and/or mixed-phase, etc. Another key issue is the increasing deployment of distributed generators. Distributed generators draw a lot of attention as they can provide numerous benefits to all parts of the distribution system, such as decreasing energy losses, reactive power support, preserving the needed voltage profile and providing clean energy. The downside of distributed generator usage is when faults occur, and fault currents can then have more than one source, and making fault detection and location more complicated. What makes fault location and detection an even more complex problem is that distribution networks are often formed without any intentional grounding—they are formed as ungrounded distribution networks. Such networks are used in Italy, Japan, Ireland, Russia, Peru and Spain. This configuration limits fault currents of single-phase-to-ground faults to very low values, even close to nominal ones. As a result, it is very hard to detect these types of faults, allowing the network to continue normally with its operations until a second fault occurs. At this time, fault currents are high and there exist simultaneous faults in the network which should be detected and located.

Many works have been done for fault detection and location determination in distribution networks. These methods can be classified into three categories, impedance-based methods, travelling wave-based methods and high frequency-based methods. Impedance based methods are based on the relationship between line frequency of voltages and currents, and are the most commonly used ones in distribution networks due to the least requirements for the measurements. Travelling wave-based methods are based on the analysis of propagation time associated with fault effects. Unfortunately, this family poses complications under complex topologies. High frequency-based methods are based on high frequency information within voltage and current measurements. For example, patent application US20030085715A1 discloses a method to locate a fault by detecting a faulted phase from the plurality of phases of the power distribution system. A measurement signal having a measurement frequency is injected into the detected faulted phase, the measurement frequency being a different frequency than the line frequency. The fault location is determined for a selected segment based on at least one measured residual current corresponding to the injected signal and a predetermined relative impedance of the power distribution system. Another example as in patent application US20120112758A1, an enhanced ground fault detection and location apparatus is disclosed by using the apparatus in conjunction with specific circuit analysis methods. The disclosed apparatus comprises the functionality of a voltmeter, an ammeter, a phase angle meter, a frequency generator, and a variable power supply, thereby providing for a variety of signals and analyses to be performed on an unintentionally grounded circuit in an ungrounded AC or DC power distribution system. Yet another example can be found in U.S. Pat. No. 4,528,497A, it discloses a device for monitoring ungrounded power distribution systems that indicates the total hazard current from the isolated power conductors to ground. A measurement signal having at least two frequency components different from the power system line frequency is applied across the combined fault impedances that occur between the power conductors and ground. Voltage responses to the measurement signal components are separated from the power system line voltage and from each other by frequency selective means. The voltage responses are applied to the computational circuit whose output is proportional to the maximum fault admittance magnitude at the line frequency. A gain signal related to the imbalance of the fault impedances of the different power conductor is used to scale the previously described voltage responses. Thus, the output of the computation circuit is scaled to be proportional to the largest fault admittance on the distribution system which in turn is proportional to the total hazard current of the system.

Unfortunately, all prior of arts have limitations, for example, they are only applicable for single fault detections, difficult to deal with systems with distributed generations, and required additional devices. Therefore, there is a need for a fault detection and location determination procedure for simultaneous faults. Such a procedure should be usable for all types of simultaneous faults, practically implementable that means an excessive amount of instrumentation, computing power and time is not needed, and usable in realistic distribution networks which are unbalanced, mixed-phase and included different types of DGs.

SUMMARY OF THE INVENTION

The present disclosure relates generally to electric power systems, and more particularly to simultaneous fault detection and location of power distribution systems.

This application discloses a fault detection and location algorithm for simultaneous faults in unbalanced three-phase distribution networks with presence of distributed generators. A multi-end measurement and impedance-based algorithm is used for both detection and location. This algorithm is suitable for both grounded and ungrounded distribution systems with penetration of distributed generators at which simultaneous faults often occur.

In according to some embodiments of the present disclosure, a system for detecting and locating simultaneous faults in a distribution network having buses equipped with measurement units, the buses including primary and secondary buses connected with two-terminal sections is realized. In this case, the system includes an interface to receive, from the measurement units every preset period of time, signals indicating measured three-phase voltages and three-phase currents of buses and corresponding locations of the buses in the distribution network via a communication network; a memory to store computer-executable programs including series impedances and shunt admittances of the two-terminal sections, a pre-fault connectivity topology of the distribution network and a fault detection program configured to detect simultaneous faults and identify locations of the simultaneous faults in the distribution network, and; at least one processor, in connection with the memory and the interface. The processor is configured to perform the fault detection program that comprises steps of: providing the series impedances and shunt admittances and the pre-fault connectivity topology; determining if simultaneous faults have occurred on line sections in the distribution network by computing phase current mismatches at terminal buses of the line sections using measured phase currents and derived phase currents, wherein the derived phase currents are calculated by applying the measured phase voltages to the pre-fault connectivity topology; determining a location for each of the simultaneous faults if the simultaneous faults detected are on non-adjacent sections in the distribution network; determining locations of the simultaneous faults if the simultaneous faults detected are on adjacent sections in the distribution network; and outputting, via the interface, data of a post-fault topology indicating the detected fault sections and locations of the faults in the distribution network.

Further, an embodiment of the present disclosure provides a method for detecting and locating simultaneous faults in a distribution network connected to energy systems of customers for powering the energy systems of the customers. In this case, the distribution network includes primary and secondary buses connected with two-terminal sections, and the method includes receiving measured three-phase voltages and currents from the primary buses via a communication network; at least one processor, in connection with the memory and the interface, to perform the fault detection program that comprises: providing series impedances and shunt admittances of each two-terminal sections, and a pre-fault connectivity topology; determining if simultaneous faults are occurring by verifying at least terminal buses of two line sections having phase current mismatches determined as the differences between the measured values and derived values using pre-fault connectivity topology and phase voltages that are greater than a threshold; determining a location for each fault individually if the faults are occurring at non-adjacent sections in the distribution network; determining locations of the faults jointly if the faults are occurring at adjacent sections in the distribution network; outputting a post-fault topology indicating line sections having faults and locations of the faults; and isolating faulted sections by activating switching operations for connected switches to the faulted sections through a computing device that communicatively linked to distribution system grid via communication network.

In accordance with embodiments of the present invention, it become possible for fault detection system to quickly detect faults in the power distribution system even when the computation process of detecting faults is increasingly scaled with the complexity of fault events on the power distribution system. This also provides advantages that can reduce central processing unit (CPU) usage in the system and power consumption, which improves the performance of the processor(s).

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

Figure 1A:
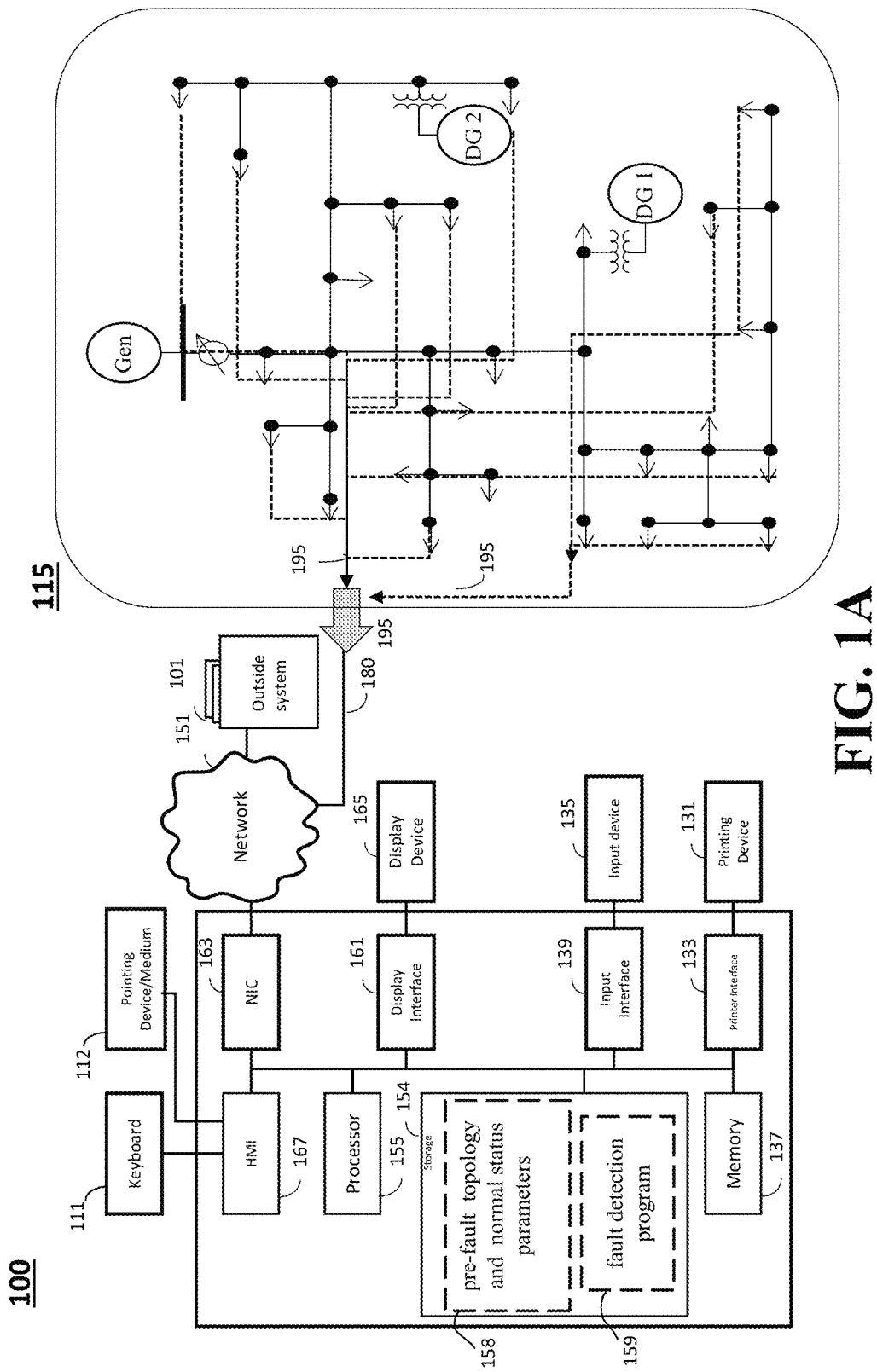
FIG. 1A is a block diagram illustrating a method for detecting and locating simultaneous faults of a power distribution system, according to embodiments of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION OF THE PREFERRED EMBODIMENTS

Overview

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

The present disclosure relates to electric power systems, and more particularly to simultaneous fault detection and location of power distribution systems.

This disclosure presents a fault detection and location procedure for simultaneous faults. It is suitable for detecting and locating simultaneous faults on unbalanced mixed-phase distribution networks with distributed generations. The method utilizes multi-end measurements and device impedances to determine the current changes caused by the faults, then detect and locate the faults through circuit analysis.

The developed procedure here is for simultaneous fault detection and location in realistic distribution networks as well as a single fault detection and location. Since simultaneous faults are tackled, with DGs presented which cause bi-directional current flow, a multi-end measurement procedure is needed. Or rather, voltage and current measurements are required at all load and generation buses. Fault conditions such as fault impedances are not required. In this disclosure, the fault location is defined as the distance of the fault from the sending bus of the faulted section. It is taken as the percentage of the section length, and as such takes values from 0 to 1.

FIG. 1A shows a block diagram of a fault detection and control system 100 according to some embodiments of the invention. The fault detection and control system 100 includes a human machine interface (HMI) 167 connected to a keyboard 111 and a pointing device/medium 112, a processor 155, a storage device 154, a memory 137, a network interface controller 163 (NIC) connected to a network (communication network) 151 including local area networks and internet network, a display interface 161 connected to a display device 165, an input interface 139 connected to an input device 135, a printer interface 133 connectable with a printing device 131. In the present disclosure, the fault detection and control system may be referred to as the system 100.

The fault detection and control system 100 can receive electric signals 195 indicating phase currents and phase voltages measured by measurement devices (units) arranged in a power distribution network system 115 via bi-way communication links 180 and the network 151 connected to the NIC 163. In this case, the bi-way communication links 180 can be communication channels that include air medium for radio communications, copper cables for wired communications, and optical fiber cable for fiber-optic communications, and each of the electric signals 195 includes location information or address information of each measurement device. In other words, when the fault detection and control system 100 receives an electric signal indicating phase currents and phase voltages of a measurement device, the system 100 can also determine or detect a physical location (or address) of the measurement device (unit) transmitting the electric signal, so that the system 100 can identify or determine its corresponding bus and line sections connected to the bus with the measurement device. For instance, the measurement devices may include switching devices 110A, 110B, 110C or sensors 150A, and 150B (see FIG. 1D).

In some case, the sensor 150A may be included in the energy systems of customers 175 for powering the energy systems of the customers, so that the signals provided by the sensor 150A can be used for estimating phase voltages and phase currents and identifying faulted line sections in the power distribution network system 115. Further, the sensor 150B may be included in a distribution generations source (distributed power supply system) 120 and the signals provided from the sensor 150B can also be used for estimating phase voltages and phase currents and identifying faulted line sections in the power distribution network system 115.

Accordingly, the fault detection and control system 100 can identify the locations and line segments by receiving the signals (measured signals including phase currents and phase voltages) transmittted from the measurement devices arranged at the individual buses on the power distribution network system 115 and using the processor 155 performing the fault detection program 159 with the pre-fault topology and normal status parameters 158 stored in the storage 154 in FIG. 1A.

Further, the network 151 is connected to an outside system(s) 101 that can provide control signals to the measurement devices of the power distribution network system 115 for performing remote control of the measurement devices. Further, the power distribution network system 115 is connected to power generators and energy systems of customers for powering the energy systems of the customers by outputting electricity to the energy systems of the customers.

Further, the fault detection and control system 100 can provide the outside system 101 fault detection status data (signals) via the network 151 so that the outside system 101 can control switching operation arranged in the power distribution network system 115. Further, the fault detection and control system 100 can be controlled from the outside system 101 by receiving control data (signals) of the fault detection and control system 100 via the network 151.

The storage device 154 includes a pre-fault topology and normal status parameters 158 with respect to the power distribution network system 115 and a fault detection program module 159. The input device/medium 135 may include modules that read programs stored on a computer readable recording medium (not shown). In some cases, the pre-fault topology can be referred to as a normal topology.

For detecting a fault or multiple faults in the power distribution network 115, the fault detection and control system 100 may receive the status data of the power distribution network system 115 from the measurement units included in the power distribution network system 115.

In accordance with some embodiments of the present disclosure, the power distribution network system 115 may include primary and secondary buses connected with two-terminal sections. The two-terminal sections can be a transformer, a voltage regulator, a phase shifter, or a line section. The fault detection and control system 100 uses the interface 163 to receive measured signal 195 (or signal vectors) indicating 3-phase currents and voltages of the primary buses via the network 151 (communication network). For instance, individual buses are equipped with current and voltage measuring units (not shown in the figure), and each of the current and voltage measuring units can transmit signals indicating 3-phase currents and voltages of the buses via the bi-way communication links 180.

The memory 137 can load the computer-executable programs stored in the storage 154, in which the computer-executable programs include 7-models for line sections with a pre-fault (normal status) topology 158 and a normal voltage vector and a current vector (not shown) of the primary buses and a fault detection program (module) 159 configured to detect the faults caused in the power distribution network system 115 and identify locations of the faults in the distribution network 115. At least one processor 155 in connection with the memory 137 and the interface 163 are used to perform the fault detection program 159 loaded from the storage 154. For instance, when performed by the processor 155, the fault detection program 159 causes the processor 155 to provide the 7-models for line sections and the normal connectivity topology from the storage 154, and the processor 155 determines if a fault (or multiple faults) is caused in the power distribution network system 115 by comparing a threshold and a difference value between the measured phase currents and derived phase currents using normal topology and phase voltages at each of the buses. Further, the processer 155 determines a location for each fault individually or jointly using the available measurements and the connectivity topology through circuit analysis. Then the processor 155 outputs a post-fault topology indicating a location of the fault. In this case, each of the primary buses may include a 3-phase current and voltage measurement device (unit) connected to the communication network. Further, the interface (NIC) 163 can receive the measured signals every preset period of time via the network 151 from the power distribution network system 115.

In some cases, the instructions to start/perform detecting the faults may be transmitted to the fault detection and control system 100 using the keyboard 111 or from the outside system 101 via the network 151. Specific examples are described in more detail below.

Figure 1B:
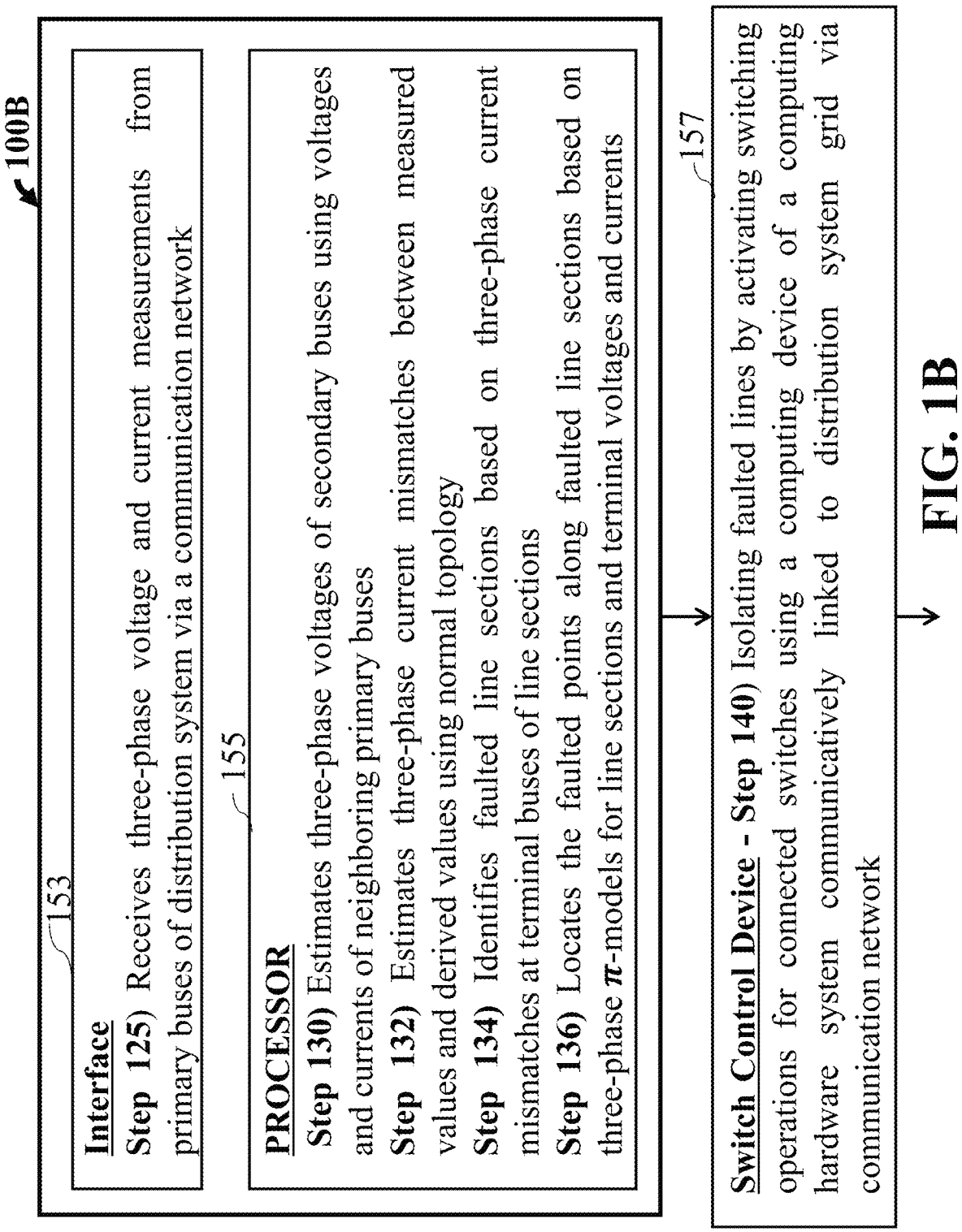
FIG. 1B is a schematic illustrating components and steps of detecting and locating simultaneous faults of a power distribution system, according to embodiments of the present disclosure.

FIG. 1B is a block diagram illustrating a fault detection and location method 100B applied in the fault detection and control system 100 for detecting and locating simultaneous faults of a power distribution system, according to embodiments of the present disclosure.

The fault detection and location method 100B performs steps 125, 130, 132, 134, 136 and 140 by using an interface 153, a hardware processor 155 (or processor 155) and a switch control device 157. The switch control device 157 may be included in the fault detection and control system 100 or an outside system 101 connected to the fault detection and control system 100. Step 125 is performed by using the interface 153 to receive the measure signals indicating three-phase voltage and current measurements of primary buses of distribution system 115 via a communication network 151. Further, the hardware processor 155 is configured to perform steps 130, 132, 134 and 136 based on the fault detection program 159 stored in the storage 154. Each of the steps is described below.

Step 130 estimates three-phase voltages of secondary buses using voltages and currents of neighboring primary buses.

Step 132 estimates three-phase current mismatches between measured values and derived values using normal topology.

Step 134 identifies faulted line sections based on three-phase current mismatches at terminal buses of line sections.

Step 136 locates the faulted points along faulted line sections based on three-phase IT-models for line sections and terminal voltages and currents.

Step 140 isolates faulted lines by activating switching operations for connected switches using the switch control device 157 via communication network.

Figure 1C:
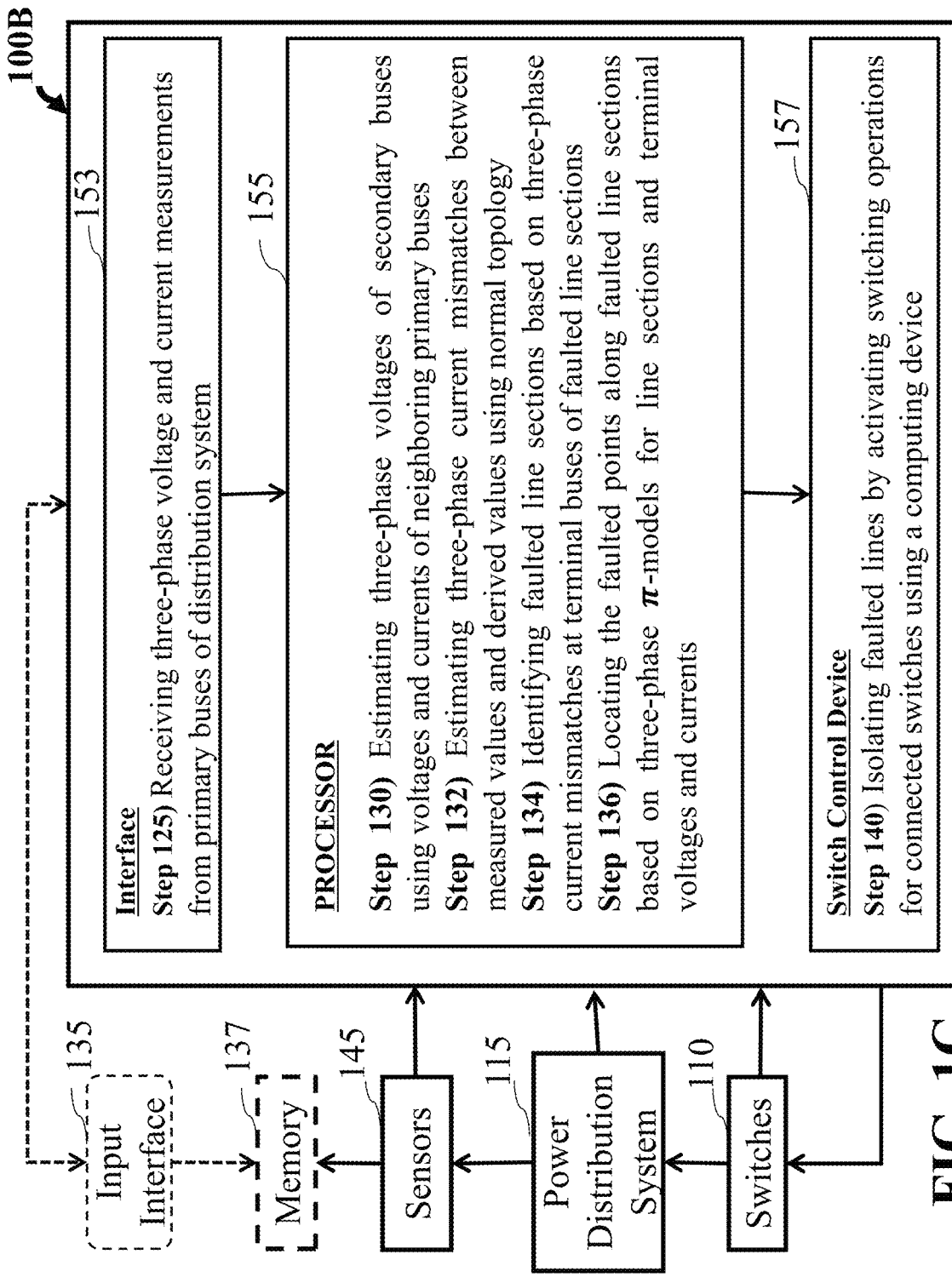
FIG. 1C is a block diagram illustrating a fault detection and control system for detecting faults of multiple locations in a power distribution network according to some embodiments of the invention.

FIG. 1C is a schematic illustrating a fault detection and location method 100B performing steps of detecting and locating simultaneous faults of a power distribution system 115 by associating components in the fault detection and control system 100, according to embodiments of the present disclosure.

FIG. 1C shows a hardware processor 155 in communication with an input device 135 (or input device/medium 135), a memory 137, an interface 153, a switch control device 157. The switch control device 157 can be connected to the set of switches 110 (in FIG. 1D) that installed in the power distribution system 115. The power distribution system can have a set of measurement units or sensors 145 (not shown in FIG. 1A) at respective buses to monitor and collect the condition information of the system 115. The fault control system implemented with method 100 can control the set of switches 110 as well as can send and receive information. It is contemplated the hardware processor 155 can include two or more hardware processors depending upon the requires of the specific application. Certainly, other components may be incorporated with method 100 including input interfaces, output interfaces and transceivers.

Still referring to FIG. 1C, aspects of the fault detection and location method 100B include step 125 of using an interface 153 to receive three-phase voltage and current measurements of primary buses of distribution system via a communication network.

Step 130 estimates three-phase voltages of secondary buses using voltages and currents of neighboring primary buses. Step 132 includes estimating three-phase current mismatches between measured values and derived values using normal topology. Step 134 identifies fault line sections based on three-phase current mismatches at terminal buses of line sections. Step 136 locates the faulted points along faulted line sections based on three-phase IT-models for line sections and terminal voltages and currents.

Step 140 isolates faulted lines by activating switching operations for connected switches using the switch control device 157 via communication network.

Figure 1D:
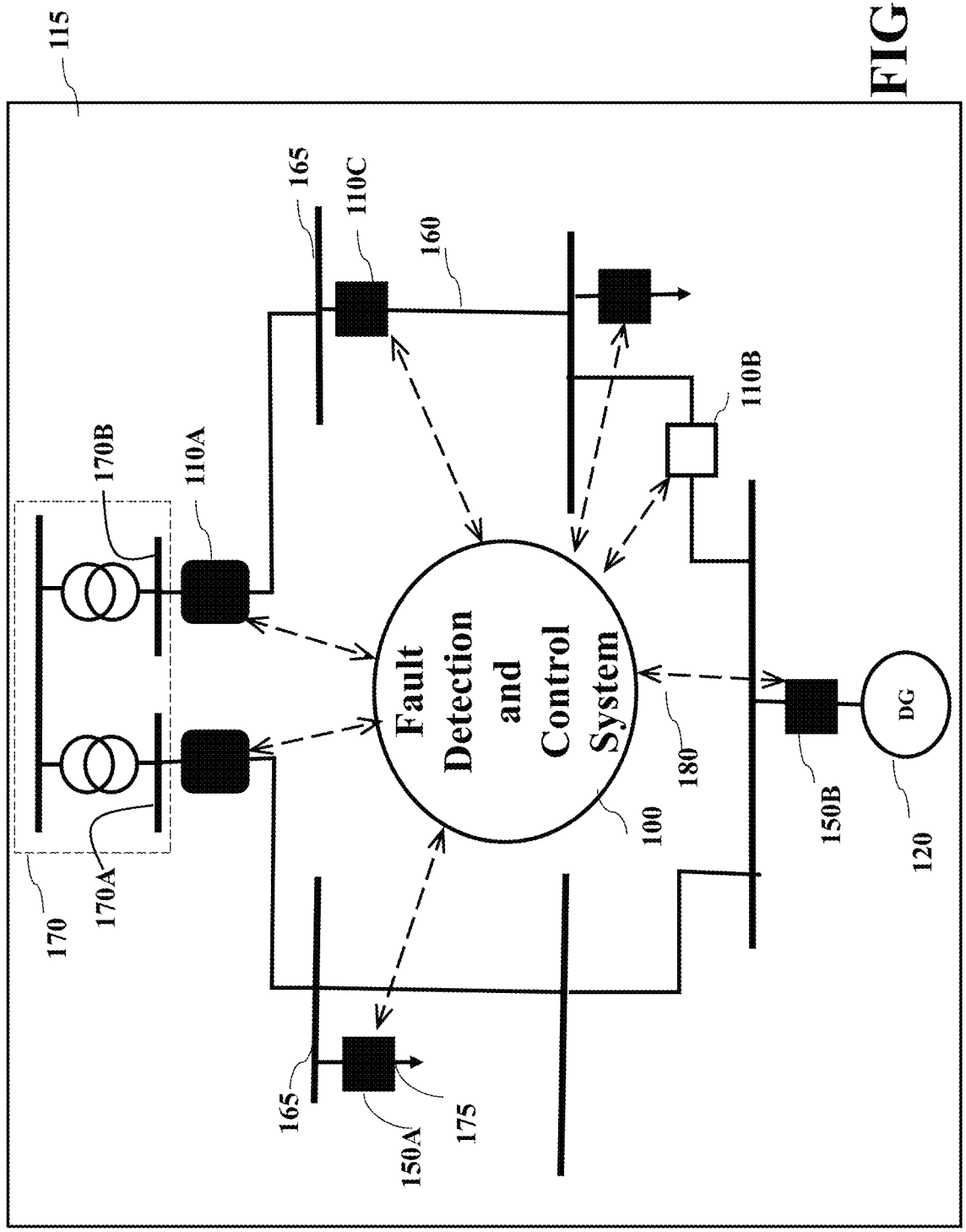
FIG. 1D is a schematic illustrating components of a power distribution system, according to some embodiments of the present disclosure.

FIG. 1D is a schematic illustrating components of a power distribution system, according to some embodiments of the present disclosure. The power distribution system 115 is operated by a fault detection and control system 100. It transfers the powers supplied by the main grid substation 170 and distribution generation sources 120 to the power customers loads 175 through distributions lines 160. In some cases, the distribution generation sources 120 may be connected to a sensor 150B, and The generation sources can include a main grid 170, and various distribution generations sources 120 such as micro-turbines, photovoltaic, wind turbine, or battery. Each distribution line 160 is connected with two buses 165 and a sensor or switch 110C, and each bus can be be connected with generation sources 120, power customers 175 and other lines (not shown). In some cases, the power customers 175 and other lines may be connected to the bus 165 via sensors 150A. The power distribution network system 115 is normally fed by the main grid through a substation 170. The substation may include multiple transformers, 171 A and 171 B.

Still referring to FIG. 1D, the connectivity topology of the power distribution system 115 is determined and can be adjusted by the statues of switching devices 110A and 110B in the system 115. Further, the switching devices 110A and 110B may be arranged in/with circuit breakers, reclosers or switches arranged in ground fault/short-circuit protection relay sensors, and the switching device(s) 110C may be arranged between the distributions lines 160.

The switching devices can be closed, 110A (indicating closed status in the figure) or be opened, 110B (indicating open status in the figure) remotely by the fault detection and control system 100 with the bi-way communication links 180. A normally closed switch is usually called sectionizing switch, and a normally opened switch called tie switch. Those switching devices are commonly equipped with the measurement units or sensors 145 to send back switch statuses, switch terminal voltages, and power flows through the devices to the fault detection and control system 100. The measurement units or sensors 145 may be installed within the buses connected to the network 151 for monitoring the conditions of the system 115. For instance, the measurement units or sensors 145 arranged in the buses in the power distribution network system 115 can provide magnitudes of phase voltages and phase currents as well as phase angle values for the phase voltages and phase currents. In accordance with embodiments of the present disclosure, it is understood that the signals indicating the currents and voltages measured and provided by the measurement devices (e.g. switching devices, sensors, or measuremt units) also include information on locations of the buses in the power distribution network system 115 represented by the pre-fault topology and normal status parameters 158.

The measurement units and the sensors 145 can be phasor measurement units (PMUs), remote terminal units (RTUs), fault indicators (FIs), fault disturbance recoders (FDRs), digital relays or other devices that can communicate with the fault detection and control system 100 via one-way or two-way communication links 180 connected to the network 151. One embodiment of the present disclosure adjusts or controls the statuses of switching devices to isolate the identified faulted line sections. Further, the measurement units and the sensors 145 include the switching devices 110A, 110B and 110C and the sensors 150A, and 150B that can transmit signals 195 including magnitudes of phase currents and voltages as well as corresponding phase angle values to the fault detection and control system 100 using the bi-way communication links 180 via the network 151.

The measurements provided by the switching devices, 110A, 110B and 110C, and sensors, 150 A and 150B include the phase voltages at the corresponding bus that the device or sensor connected to, and the phase injection currents that injected into the bus from a distributed generation or a load demand (measured by 150 A, and 150 B), or phase line currents that flowed away the bus through a two-terminal section (measured by 110 A, 110B and 110C). The phase voltage measurement is a voltage between the measured phase and the ground.

In some cases, the measurement accuracy of the each of the switching devices 110A, 110B and 110C and the sensors 150A, and 150B can be different from each other. In such a case, individual measurement values (phase voltages, phase currents and phase values, etc) obtained from the signals 195 of the switching devices 110A, 110B and 110C and the sensors 150A, and 150B may be modified (corrected) by multiplying (or according to) corresponding predetermined weighted factors stored in the storage 154 (or memory), so that the fault detection program 159, being executed by the processor(s) 155, can output better results (more accurate results of fault detections) with respect to the signals 195 from the the switching devices 110A, 110B and 110C and the sensors 150A, and 150B in order to locate/detect fault(s) occurred in the power distribution network system 115. It is noted that signals 195 from the the switching devices 110A, 110B and 110C and the sensors 150A, and 150B and the measurement units or the sensors 145 included in the buses are configured to transmit the signals 195 to the fault detection and control system 100 via the the bi-way communication links 180 and the network 151.

In the present disclosure, the buses are partitioned into primary buses and secondary buses. For primary buses, both phase voltages and phase currents are measured, and they are usually connected with a distributed generator, a load, or equivalent connection point with main grid. For secondary buses, their phase voltages and currents are not measured, and they are usually junction buses and not connected with generators, loads or main grid. The equivalent measured phase injection currents can be regarded as zero.

Power Distribution System with Faults

Figure 2:
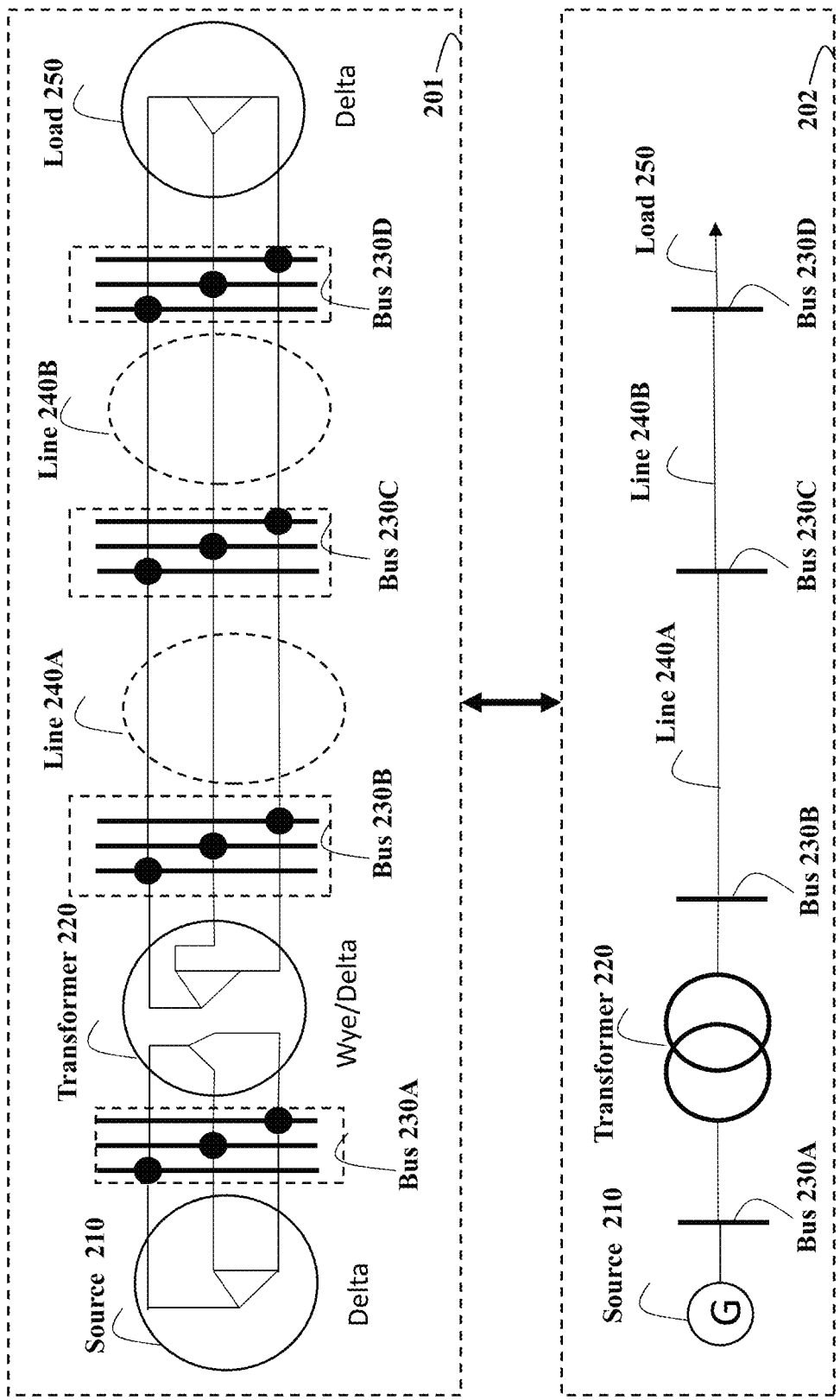
FIG. 2 is a schematic illustrating single-line and three-phase representations of a power distribution system, according to some embodiments of the present disclosure.

FIG. 2 shows schematic diagrams of a sample power distribution system including both the three-phase representation 201 and one-line diagram 202. The sample system includes one Delta-connected three-phase generation source 210, one three-phase transformer 220 with WYE/DELTA connection, two three-phase distribution lines 240A and 240B, and one DELTA-connected three-phase load 250. There are four three-phase buses in the system, including bus 230A, bus 230B, bus 230C and bus 230D.

The buses are connected with each other through two-terminal sections, i.e. branches. A two-terminal section can be a line section, a transformer, a voltage regulator, or a phase shifter. The relationship between branch currents and terminal bus voltages of a three-phase branch between a sending bus p and a receiving bus s can be described as follows:

$$\begin{bmatrix} I_{ps} \\ I_{sp} \end{bmatrix} = \begin{bmatrix} Y_{pp} & Y_{ps} \\ Y_{sp} & Y_{ss} \end{bmatrix} \begin{bmatrix} V_p \\ V_s \end{bmatrix}, \quad (1)$$

wherein $I_{ps}$ and $I_{sp}$ are 3-by-1 vectors that represent the phase line currents flowing away from bus p and bus s through the branch between bus p and bus s, respectively. The vectors $V_p$ and $V_s$ are 3-by-1 vectors that represent the phase-to-ground voltages at bus p and bus s. The matrices $Y_{pp}$ and $Y_{ss}$ are 3-by-3 matrices that represents the self-admittance matrix elements at bus p and bus s, and $Y_{ps}$ and $Y_{sp}$ are 3-by-3 matrices that represents the mutual admittance matrices between bus p and bus s, and bus s and bus p, respectively.

This equation can be used to model any impedance-based sections, such as a three-phase line section, or a three-phase transformer. For a three-phase transformer, $I_{ps}$ and $I_{sp}$ are the vectors of phase currents flowing into the primary and secondary sides, $V_p$ and $V_s$ are the vectors of phase-to-ground voltages at the buses of primary and secondary sides. The matrices $Y_{pp}$ and $Y_{ss}$ are the self-admittance matrices of primary side and secondary side, $Y_{ps}$ and $Y_{sp}$ are the mutual admittances between the primary and secondary sides. The admittances can be determined based on the transformer impedances and its tap positions. For a line segment between bus p and bus s, the self-admittance and mutual matrices are determined based on its series impedance matrix, and shunt admittance matrix.

Figure 3A:
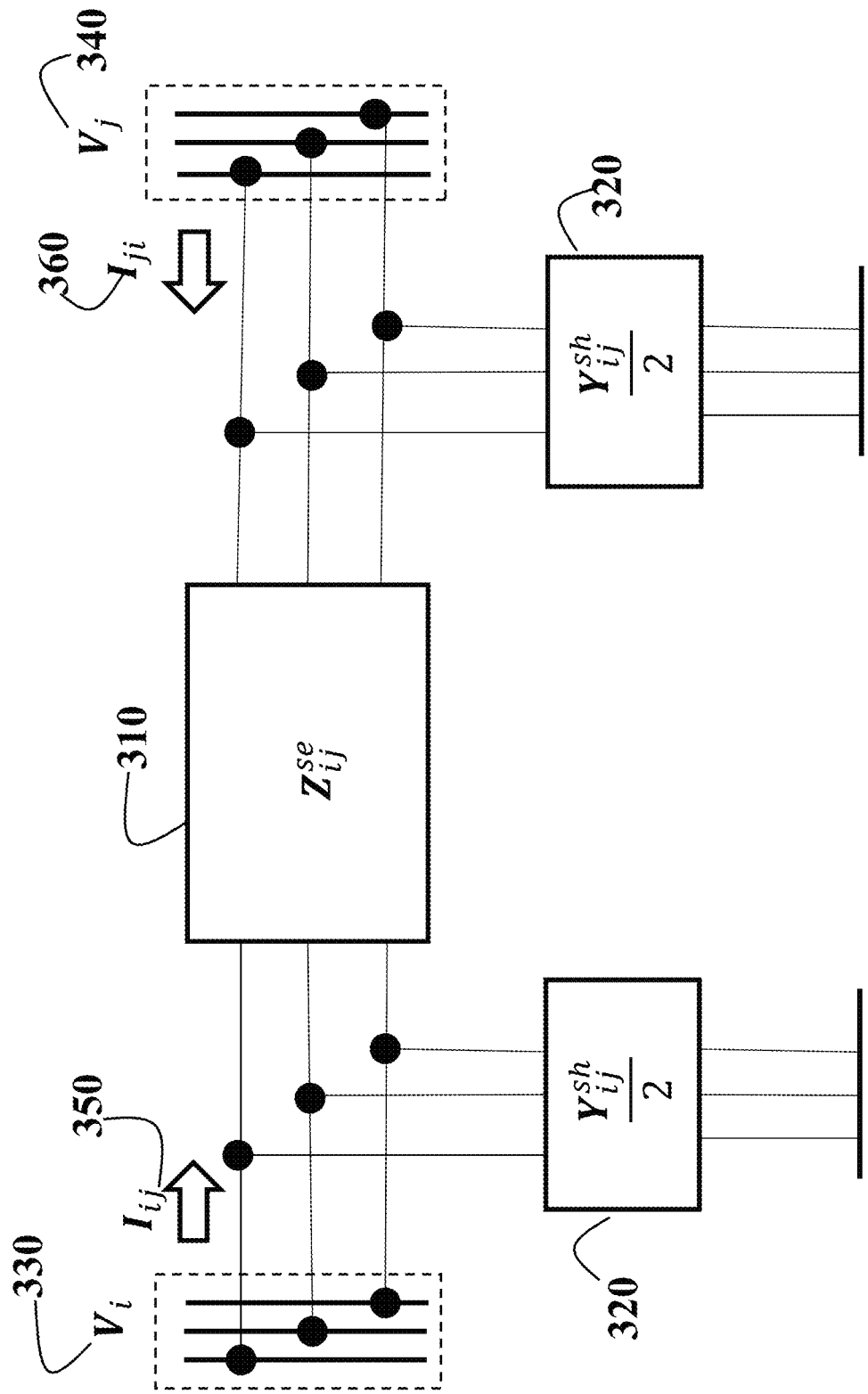
FIG. 3A is a schematic illustrating the $\pi$-model for a distribution line at normal condition, according to some embodiments of the present disclosure.

Any line section under normal operational conditions can be represented using a π-equivalent model as shown in FIG. 3A. In FIG. 3A, the line section between bus i and bus j is modeled using a branch series impedance matrix $Z_{ij}^{se}$ 310 and a branch shunt admittance matrix $Y_{ij}^{sh}$ 320 with dimension of $|\Phi_{ij}| \times |\Phi_{ij}|$, $|\Phi_{ij}|$ is the cardinality of $\Phi_{ij}$ which is the set of phases. The inverse of impedance matrix $Z_{ij}^{se}$ is represented by a branch series admittance $Y_{ij}^{se}$, i.e. $Y_{ij}^{se} = (Z_{ij}^{se})^{-1}$. If $\Phi_{ij} = \{a, b, c\}$, the branch series impedance and shunt admittance matrix can be defined as $$Z_{ij}^{se} = \begin{bmatrix} Z_{ij}^{se-aa} & Z_{ij}^{se-ab} & Z_{ij}^{se-ac} \\ Z_{ij}^{se-ba} & Z_{ij}^{se-bb} & Z_{ij}^{se-bc} \\ Z_{ij}^{se-ca} & Z_{ij}^{se-cb} & Z_{ij}^{se-cc} \end{bmatrix}, \text{ and}$$

$$Y_{ij}^{sh} = \begin{bmatrix} Y_{ij}^{sh-aa} & Y_{ij}^{sh-ab} & Y_{ij}^{sh-ac} \\ Y_{ij}^{sh-ab} & Y_{ij}^{sh-bb} & Y_{ij}^{sh-bc} \\ Y_{ij}^{sh-ac} & Y_{ij}^{sh-cb} & Y_{ij}^{sh-cc} \end{bmatrix}.$$

For line section between a terminal bus i and a terminal bus j, its phase line currents at terminal buses are related to its phase voltages at terminal buses according to:

$$I_{ij} = \left( Y_{ij}^{se} + \frac{Y_{ij}^{sh}}{2} \right) V_i - Y_{ij}^{se} V_j \qquad (2a)$$

$$I_{ji} = -Y_{ij}^{se} V_i + \left( Y_{ij}^{se} + \frac{Y_{ij}^{sh}}{2} \right) V_j \qquad (2b)$$

where, $I_{ij}$ 350 and $I_{ji}$ 360 are the vectors for phase line currents at bus i and bus j with dimension of $|\Phi_{ij}| \times 1$, $V_i$ 330 and $V_j$ 340 are the vectors of phase voltages at bus i and bus j with dimension of $|\Phi_i| \times 1$ and $|\Phi_j| \times 1$, and $\Phi_i$ and $\Phi_j$ are the set of phases at bus i and bus j, respectively. For example, $\Phi_{ij} = \Phi_i = \Phi_j = \{a, b, c\}$, $I_{ij}$, $I_{ji}$, $V_i$ and $V_j$ can defined as $$\begin{bmatrix} I_{ij}^a \\ I_{ij}^b \\ I_{ij}^c \end{bmatrix}, \begin{bmatrix} I_{ji}^a \\ I_{ji}^b \\ I_{ji}^c \end{bmatrix}, \begin{bmatrix} V_i^a \\ V_i^b \\ V_i^c \end{bmatrix}$$

and $$\begin{bmatrix} V_j^a \\ V_j^b \\ V_j^c \end{bmatrix}$$

respectively.

As shown in (2), the phase line currents through the line section, $I_{ij}$ and $I_{ji}$ can be ultimately determined, if the phase voltages at terminal buses, $V_i$ and $V_j$, and the branch series and shunt admittance are given. However, if the branch series and shunt admittances are changed such as topology changes or fault occurring, the above equations need to be adjusted accordingly.

When the phase voltages and phases line currents at any terminal bus are given via the current and voltage measuring units (not shown) that are arranged to respective buses, we can determine the corresponding phase voltages and phase line currents at another terminal bus accordingly. For example, if $V_i$ and $I_{ij}$ are given, we can determine $V_j$ and $I_{ji}$ as:

$$V_j = V_i - Z_{ij}^{se} \left( I_{ij} - \frac{Y_{ij}^{sh}}{2} V_i \right) \qquad (3a)$$

$$I_{ji} = -I_{ij} + \frac{Y_{ij}^{sh}}{2} (V_i + V_j) \qquad (3b)$$

Similarly, if $V_j$ and $I_{ji}$ are given, we can determine $V_i$ and $I_{ij}$ as:

$$V_i = V_j - Z_{ij}^{se} \left( I_{ji} - \frac{Y_{ij}^{sh}}{2} V_j \right) \qquad (4a)$$

$$I_{ij} = -I_{ji} + \frac{Y_{ij}^{sh}}{2} (V_i + V_j) \qquad (4b)$$

A fault may occur at any location along a line section of a distribution system. The typical types of short circuit faults include single phase to ground fault, double phase to ground fault, three phase to ground fault, phase to phase fault, and phase to phase to phase fault. The faults can be either a bolted fault in which the faulted phase is directly connected to ground or other phase, or an impedance fault in which the faulted phase is connected with ground or other phases through impedances.

Figure 3B:
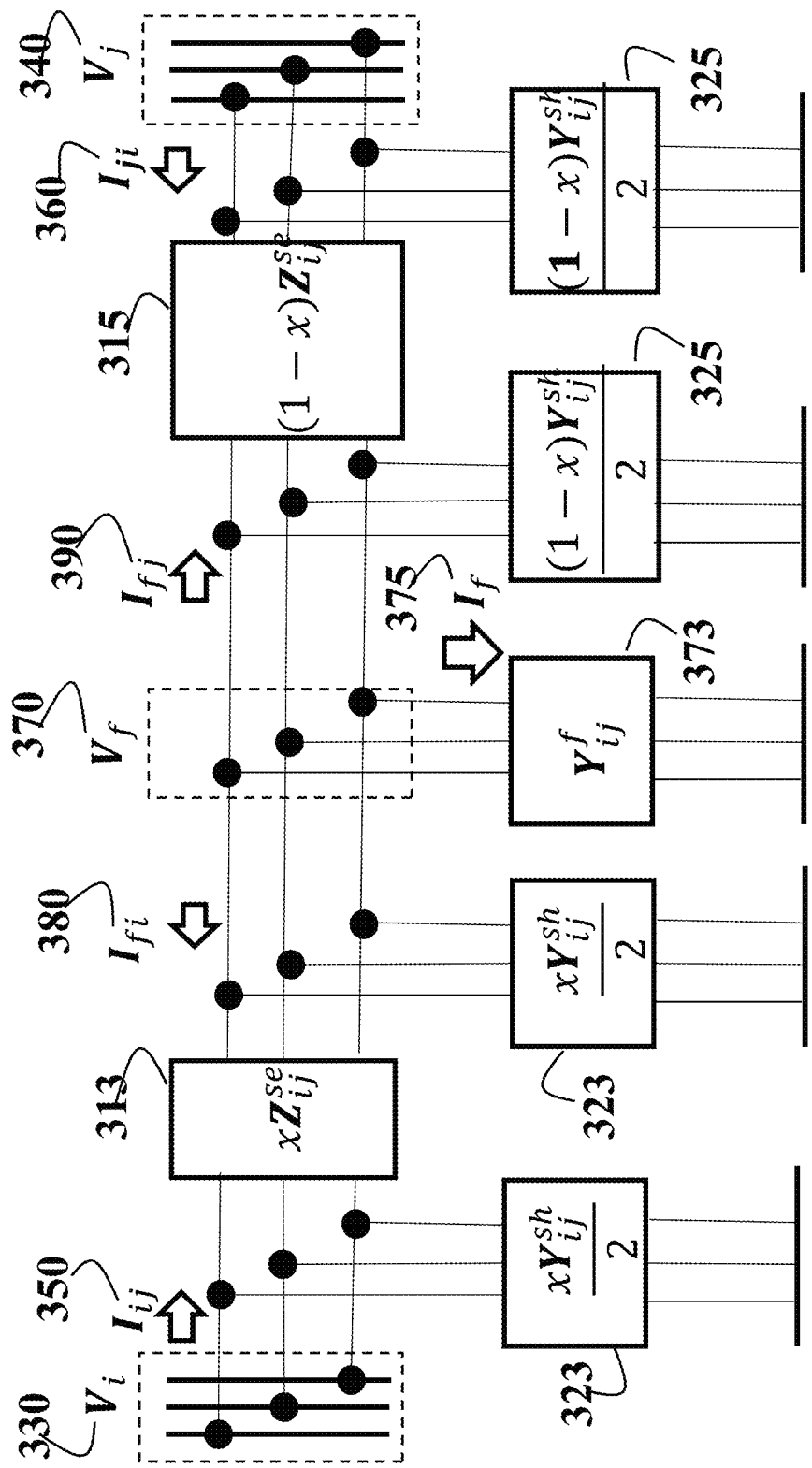
FIG. 3B is a schematic illustrating the $\pi$-model for a distribution line with a fault within the line, according to some embodiments of the present disclosure.

When there is a short circuit fault occurring on a location x along the line section between bus i and bus j, the phase current and voltage relationships can be modeled as FIG. 3B, where x is the ratio of the length of section between fault to bus i over the total length of line section between bus i and bus j. The fault can be interpreted as introducing a fictitious bus f at the corresponding section which represent the fault location.

Bus f has same phase set as line section between bus i and bus j, and can be represented as $\Phi_{ij}$. According to phase type, the phase sets for faulted bus can be divided the set of faulted phase(s), $\Phi_{ij}^f$ and the set of healthy phase(s), respectively. The faulted phases of bus f are connected with ground or between each other through fault resistance matrix $R_f$. Equivalently, we can use a fault admittance matrix $Y_{ij}^f$ 373 with respect to all phases to represent the impacts of faults at bus f based on the fault resistance matrix $R_f$ with respect to faulted phases according to:

$$Y_f^{pq} = \begin{cases} (R_f^{-1})^{pq} & (p \in \Phi_{ij}^f) \cap (q \in \Phi_{ij}^f) \\ 0 & (p \notin \Phi_{ij}^f) \cup (q \notin \Phi_{ij}^f) \end{cases} \quad (5)$$

For example, for a phase a to ground fault, $$Y_{ij}^f = \begin{bmatrix} \frac{1}{R_f} & 0 & 0 \\ 0 & 0 & 0 \\ 0 & 0 & 0 \end{bmatrix},$$

and for a fault between phase a and phase b, $$Y_{ij}^f = \begin{bmatrix} \frac{1}{R_f} & -\frac{1}{R_f} & 0 \\ -\frac{1}{R_f} & \frac{1}{R_f} & 0 \\ 0 & 0 & 0 \end{bmatrix},$$

where $R_f$ is the faulted resistance between the faulted phase and the ground, or the faulted phases.

For the line section between bus i and fault f, its series impedance and shunt admittance are fraction of corresponding values for the whole line, $xZ_{ij}^{se}$ 313 and $xY_{ij}^{sh}$ 323. The phase line currents at bus i and bus f, $I_{ij}$ 350 and $I_{fi}$ 380 are related to phase voltages at bus i and bus f, $V_i$ 330 and $V_f$ 370 according to:

$$I_{ij} = \left(\frac{Y_{ij}^{se}}{x} + \frac{xY_{ij}^{sh}}{2}\right)V_i - \frac{Y_{ij}^{se}}{x}V_f, \quad (6a)$$

$$I_{fi} = -\frac{Y_{ij}^{se}}{x}V_i + \left(\frac{Y_{ij}^{se}}{x} + \frac{xY_{ij}^{sh}}{2}\right)V_f. \quad (6b)$$

For the line section between fault f and bus j, its series impedance and shunt admittance are also fraction of corresponding values for the whole line, $(1-x)Z_{ij}^{se}$ 315 and $(1-x)Y_{ij}^{sh}$ 325. The phase line currents at bus f and bus j, $I_{fj}$ 390 and $I_{ji}$ 360 are related to phase voltages at bus f and bus j, $V_f$ 370 and $V_j$ 340 according to:

$$I_{fj} = \left(\frac{Y_{ij}^{se}}{1-x} + \frac{(1-x)Y_{ij}^{sh}}{2}\right)V_f - \frac{Y_{ij}^{se}}{1-x}V_j, \quad (7a)$$

$$I_{ji} = -\frac{Y_{ij}^{se}}{1-x}V_f + \left(\frac{Y_{ij}^{se}}{1-x} + \frac{(1-x)Y_{ij}^{sh}}{2}\right)V_j. \quad (7b)$$

For bus f, the sum of phase line currents must be zero:

$$I_{fi} + I_{fj} + Y_{ij}^f V_f = 0 \quad (8)$$

The currents flow into the ground, $I_f$ 375 is determined as $Y_f^f V_f$.

Fault Detection and Locating of Power Distribution System

A method for performing the fault detection and location of a power distribution system as well as a simultaneous fault detection and location method, which are included in the fault detection program 159, are described below.

Figure 4A:
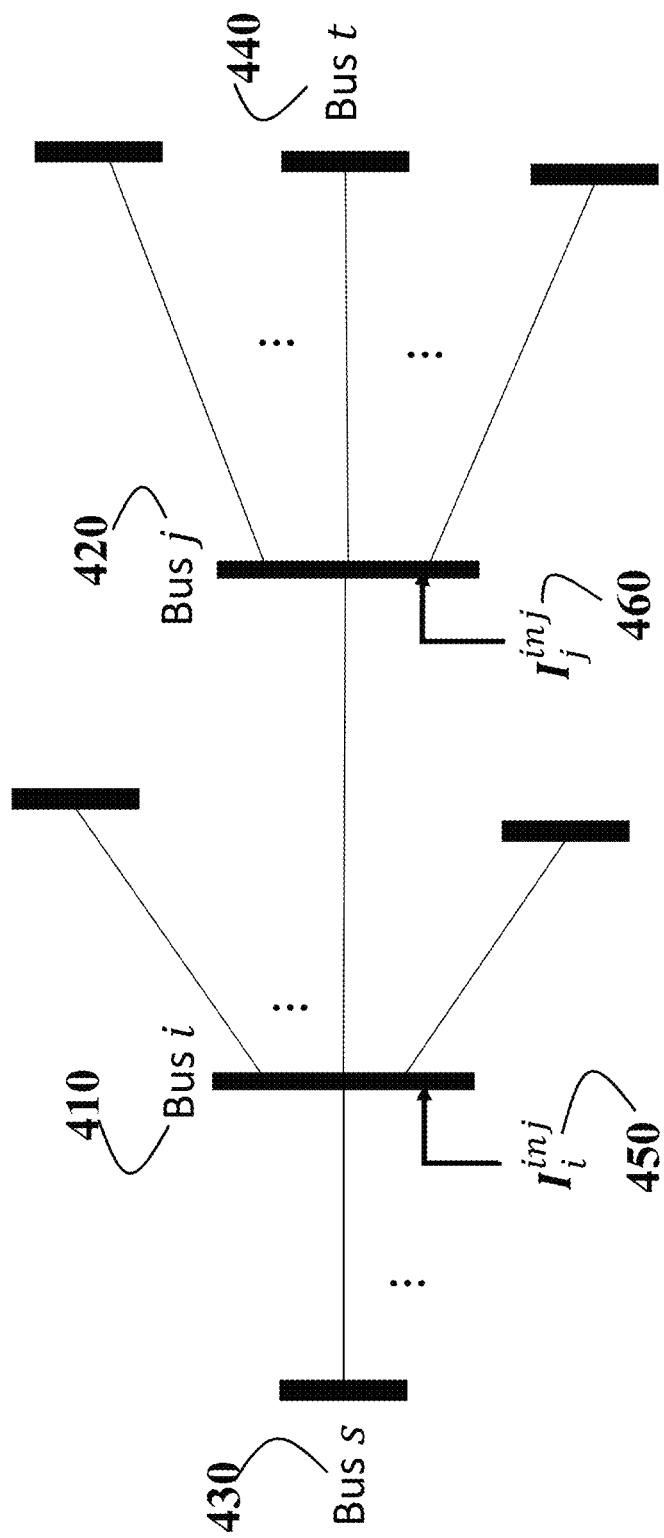
FIG. 4A is a schematic illustrating a portion of distribution system at normal condition, according to some embodiments of the present disclosure.

FIG. 4A is a schematic illustrating a portion of distribution system at normal condition, according to some embodiments of the present disclosure. All line sections, including the section between bus i 410 and bus j 420 are at normal condition. The power distribution system at the normal condition power line connectivity can be referred to as a pre-fault connectivity topology (normal status topology) 158 stored with normal status parameters in the storage 154 of the fault detection and control system 100.

For the case depicted in FIG. 4A, the bidirectional phase currents on the line section between bus i and bus j are constrained by the phase current balances at its two terminal buses according to:

$$I_i^{inj} = I_{ij} + \Sigma_{s \in N(i) - \{j\}} I_{is} \quad (9a)$$

$$I_j^{inj} = \Sigma_{t \in N(j) - \{i\}} I_{jt} \quad (9b)$$

Where, N (i) and N (j) are the sets of buses that directly connected with buses i and j, i.e. 1-hop neighbors of buses i and j. $I_i^{inj}$ 450 and $I_j^{inj}$ 460 are the phase injection currents at buses i and j. $I_{is}$ and $I_{jt}$ are the phase line currents flowing through line sections between bus i 410 and bus s 430, and bus j 420 and bus t 440.

If all phase voltages at buses i and j, and their 1-hop neighbors are measured, the phase currents on connected line sections can be derived from those measured voltages, and thus the phase injection currents at those buses can be determined using the summation of corresponding derived currents on the connected line sections according to:

$$I_i^{inj-0} = I_{ij}^0 + \Sigma_{s \in N(i) - \{j\}} I_{is}^0 \quad (10a)$$

$$I_j^{inj-0} = I_{ji}^0 + \Sigma_{t \in N(j) - \{i\}} I_{jt}^0 \quad (10b)$$

$I_i^{inj-0}$ and $I_j^{inj-0}$ are the derived phase injection currents at buses i and j under normal condition. $I_{ij}^0, I_{ji}^0, I_{is}^0, I_{jt}^0$ are the derived phase currents on line sections between bus i and bus j, bus i and bus s, and bus j and bus t under normal condition, respectively.

If the phase injection currents at those buses are measured, but the measured values do not match the above-derived values, it means that the normal condition assumption is not valid, if the measured voltages are accurate.

Similarly, if the phase currents flowing through a line section, are measured, but the measured values, $I_{ij}$ and/or $I_{ji}$ do not match the derived values, $I_{ij}^0$ and/or $I_{ji}^0$, it indicates that the normal condition assumption is not valid when the measured voltages are accurate.

Figure 4B:
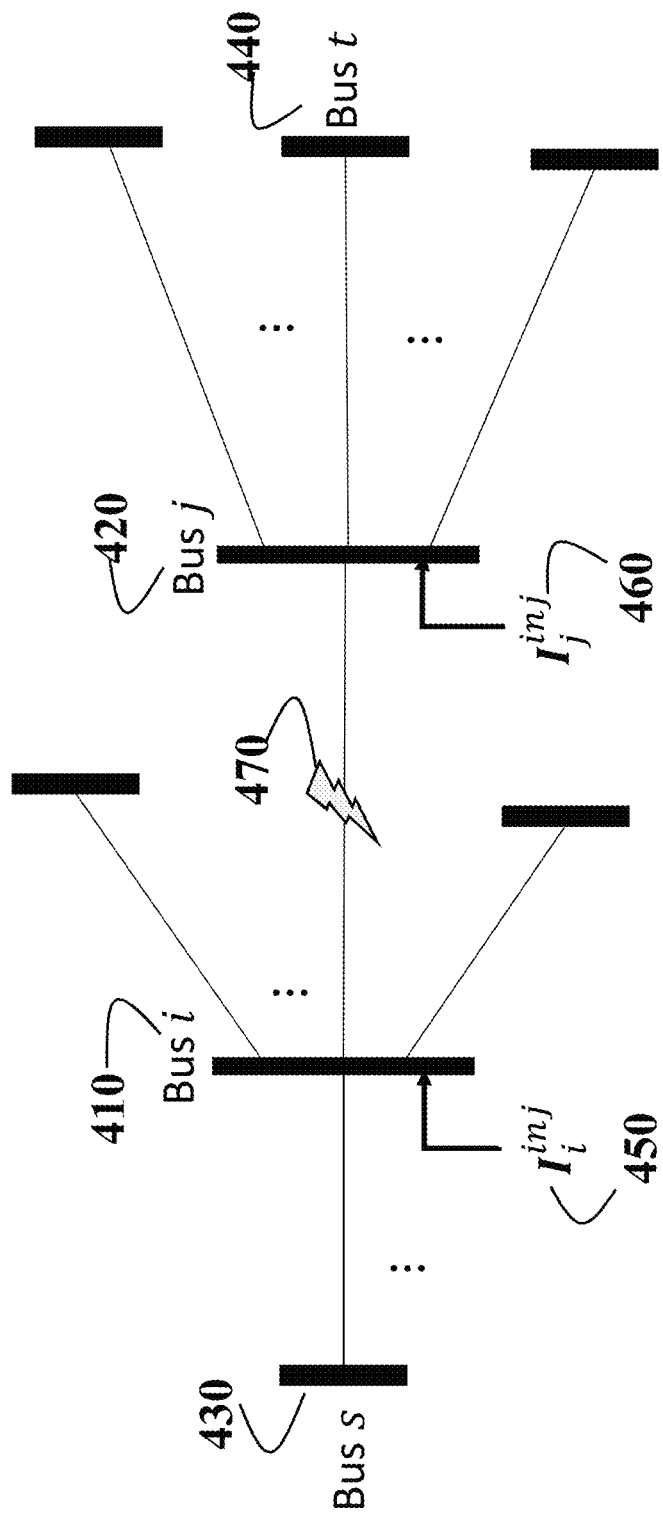
FIG. 4B is a schematic illustrating a portion of distribution system with a single fault, according to some embodiments of the present disclosure.

FIG. 4B is a schematic illustrating a portion of distribution system with a single fault 470, according to some embodiments of the present disclosure. The fault 470 is a short circuit fault occurring on the line section between bus i 410 and bus j 420 to cause at least one phase line directly connected with the ground or other phase lines. All line sections, except the section between bus i 410 and bus j 420 are at normal condition. Assumed that all phase voltage measurements are the same as the case described in FIG. 4A, we can have the following phase current balance equations:

$$I_i^{inj-f} = I_{ij}^f + \Sigma_{s \in N(i) - \{j\}} I_{is}^0 \quad (11a)$$

$$I_j^{inj-f} = I_{ji}^f + \Sigma_{t \in N(j) - \{i\}} I_{jt}^0 \quad (11b)$$

where $I_i^{inj-f}$ 450 and $I_j^{inj-f}$ 460 are the phase injection currents at bus i 410 and bus j 420 under the condition with a fault 470 occurred on section i–j. $I_{is}^0, I_{jt}^0$ are the derived phase currents on normal line sections i–s, and j–t, respectively. $I_{ij}^f, I_{ji}^f$ are the bi-directional phase current on the faulted section i–j, which can be ultimately determined when both the fault condition (representing the fault location, and fault impedances) and the phase voltages at terminals are given from respective current and voltage measuring units via the bi-way communication links 180.

Based on (10) and (11), we can have:

$$I_i^{inj\text{-}f} - I_i^{inj\text{-}0} = I_{ij}^f - I_{ij}^0 \quad (12a)$$

$$I_j^{inj\text{-}f} - I_j^{inj\text{-}0} = I_{ji}^f - I_{ji}^0 \quad (12b)$$

Let $\Delta I_i = I_i^{inj\text{-}f} - I_i^{inj\text{-}0}$, $\Delta I_j = I_j^{inj\text{-}f} - I_j^{inj\text{-}0}$, we can further have:

$$\Delta I_i = I_{ij}^f - I_{ij}^0 \quad (13a)$$

$$\Delta I_j = I_{ji}^f - I_{ji}^0 \quad (13b)$$

That means the phase current changes on faulted line section i–j can be reflected on the changes of phase injection currents at terminal bus i 410 and bus j 420, $\Delta I_i$ and $\Delta I_j$. If assumed the $I_i^{inj\text{-}f}$ and $I_j^{inj\text{-}f}$ are the actual measured phase injection currents (measured phase currents), we can determine whether there is a fault on line section i–j by calculating the difference between the measured values (measured phase currents) and the derived values (derived phase currents). In this case, the derived phase currents are calculated by assuming that the measured phase voltages are applied to the pre-fault connectivity topology. As the pre-fault connectivity topology represents a normal condition (no fault condition) in which all connected line sections in the power distribution network do not include any faults, the system 100 can determine or detect that no fault occurs in the power distribution network when the difference (magnitude or angle mismatch) between measured values (obtained based on measured phase currents) and the derived values (obtained based on derived phase currents) close to zero or less than a (fault) threshold value. The threshold value may be a predetermined magnitude or angle variation range obtained (or determined) at each of the line sections under a normal condition of the power distribution network.

In other words, the fault detection and control system 100 continuously receives the signals 195 indicating measured phase currents and phase voltages from the switching devices (e.g. 110A, 110B and 110C) and the sensors (e.g. 150A, and 150B) arranged at individual line sections between the buses in the power distribution system 115 via the interface 163 by every preset period of time. Accordingly, the fault detection and control system 100 can detect if a fault occur at the line section (or line sections) between the buses, by computing or comparing the measured values (obtained from the measured phase currents) and the derived values (obtained from the derived phase currents) at each of the line sections.

If all of phases current mismatches (difference between measured and derived values) $\Delta I_i$ and $\Delta I_j$ are close to zero or less than a threshold value, it is indicated that there is no fault on section i–j. Otherwise, there is a possibility of a fault on the section i–j, and the phases with not zero phase current mismatches are the faulted phases. Since $\Delta I_i$ and $\Delta I_j$ are complex numbers, either the absolute values (i.e. magnitude) or the angles of the complex numbers can be used to determine if the complex numbers are close to zeros. In some cases, predetermined ranges of the absolute values and the angles of the complex numbers, $|\Delta I|$ and $\angle \Delta I$ may be used as thresholds to determine that the mismatches are zeros. For instance, the acceptable fluctuation range for the magnitudes of phase current mismatches can be set as 200% of maximal normal phase currents, and the acceptable fluctuation range for the angles of phase current mismatches can be set as ±80 degrees. The absolute threshold, $|\Delta I|$ is used for detecting a single or multiple faults except a single phase to ground fault. The angle threshold, $\angle \Delta I$ is used for detecting a single phase to ground fault for ungrounded power distribution systems.

In summary, a line section is determined as a possible faulted section if the measured phase injection currents at its two terminal buses are not matched with the derived phase injection currents computed using measured phase voltages and normal topology, or the measured phase line currents flowing on the section at two directions are not matched with the derived phase line currents on the section computed using measured phase voltages and normal topology. If one terminal bus of the line section is only connected with a distribution generation source or a load, the line section is determined as a possible faulted section when the measured phase injection currents at the opposite terminal bus are not matched with the derived phase injection currents at the opposite terminal bus, or the measured phase currents flowing on the section at the direction from the opposite bus to the said terminal bus are not matched with the derived phase currents.

After the faulted section is detected, the exact fault location can be determined based on the two-subsection π-model given in FIG. 3B.

According to FIG. 3B, the phase voltages at buses i and bus j can be related to phase voltages at fault point f according to:

$$V_i = xZ_{ij}^{se}\left(I_{ij} + \frac{xY_{ij}^{sh}}{2}V_i\right) + V_f \quad (14a)$$

$$V_j = (1-x)Z_{ij}^{se}\left(I_{ji} + \frac{(1-x)Y_{ij}^{sh}}{2}V_j\right) + V_f \quad (14b)$$

Equating $V_f$ in equations (14a) and (14b) yields:

$$V_i - xZ_{ij}^{se}\left(I_{ij} + \frac{xY_{ij}^{sh}}{2}V_i\right) = V_j - (1-x)Z_{ij}^{se}\left(I_{ji} + \frac{(1-x)Y_{ij}^{sh}}{2}V_j\right) \quad (15)$$

That is:

$$\frac{1}{2}Z_{ij}^{se}Y_{ij}^{sh}(V_i - V_j)x^2 - Z_{ij}^{se}(I_{ij} + I_{ji} + Y_{ij}^{sh}V_j)x - \left(V_i - V_j + Z_{ij}^{se}I_{ji} + \frac{1}{2}Z_{ij}^{se}Y_{ij}^{sh}V_j\right) = 0 \quad (16)$$

It is obvious that (16) is a function of location x. Thus, fault locations x can be calculated by solving the following complex quadratic equations:

$$Ax^2 + Bx + C = 0 \quad (17)$$

Where, $$A = \frac{1}{2}Z_{ij}^{se}Y_{ij}^{sh}(V_i - V_j),\ B = -Z_{ij}^{se}(I_{ij} + I_{ji} + Y_{ij}^{sh}V_j),$$

$$C = -\left(V_i - V_j + Z_{ij}^{se}I_{ji} + \frac{1}{2}Z_{ij}^{se}Y_{ij}^{sh}V_j\right).$$

As the equation parameters are vectors of complex numbers, (17) can be further divided into a set of equations defined using real and imaginary parts of parameters for each phase, respectively:

$$Re(A^\phi)x^2+Re(B^\phi)x+Re(C^\phi)=0, \phi\in\Phi_{ij} \quad (18a)$$

$$Im(A^\phi)x^2+Im(B^\phi)x+Im(C^\phi)=0, \phi\in\Phi_{ij} \quad (18b)$$

Each of (18a) and (18b) can be solved separately. However, we may get conflict solutions from different equations. Therefore, instead of solving above equations individually, we replace the above problem by finding a solution that minimize the following least square equation:

$$J(x)=\Sigma_{\phi\in\Phi_{ij}}\{[Re(A^\phi)x^2+Re(B^\phi)x+Re(C^\phi)]^2+[Im(A^\phi)x^2+Im(B^\phi)x+Im(C^\phi)]^2\} \quad (19)$$

Its solution can be iteratively solved using the following equation:

$$x_{n+1} = x_n - \frac{J(x_n)}{\frac{\partial J(x_n)}{\partial x}} \quad (20)$$

Where, $x_n$ and $x_{n+1}$ are x values calculated at iterations n and n+1. $J(x_n)$ and $$\frac{\partial J(x_n)}{\partial x}$$

are least square value and derivative of least square over x calculated using $x_n$, and derivative of least square is defined as:

$$\frac{\partial J(x)}{\partial x} = \sum_{\phi\in\Phi_{ij}} \{2[Re(A^\phi)x^2 + Re(B^\phi)x + Re(C^\phi)][2Re(A^\phi)x + Re(B^\phi)] + 2[Im(A^\phi)x^2 + Im(B^\phi)x + Im(C^\phi)][2Im(A^\phi)x + Im(B^\phi)]\} \quad (21)$$

The initial x value can be set by either one of (18a), or one of (18b) using (22a) or (22b):

$$x = \frac{-Re(B^\phi) \pm \sqrt{(Re(B^\phi))^2 - 4Re(A^\phi)Re(C^\phi)}}{2Re(A^\phi)} \quad (22a)$$

$$x = \frac{-Im(B^\phi) \pm \sqrt{(Im(B^\phi))^2 - 4Im(A^\phi)Im(C^\phi)}}{2Im(A^\phi)} \quad (22b)$$

It is noted that even though (22a) and (22b) will both give two solutions, only the ones between 0 and 1 can be taken as correct values.

Simultaneous Fault Detection of Power Distribution System

For a practical distribution system, multiple faults may occur simultaneously or sequentially within a short period of time. Once such faults occur, we need firstly detecting the faults, and then pinpointing the exact locations for each fault.

The present disclosure takes faults at two different line sections as example to demonstrate the approaches for detecting and locating the multiple faults using measurements at primary buses. The approaches can be easily extended to more complicated faults, such as triple faults.

Figure 5A:
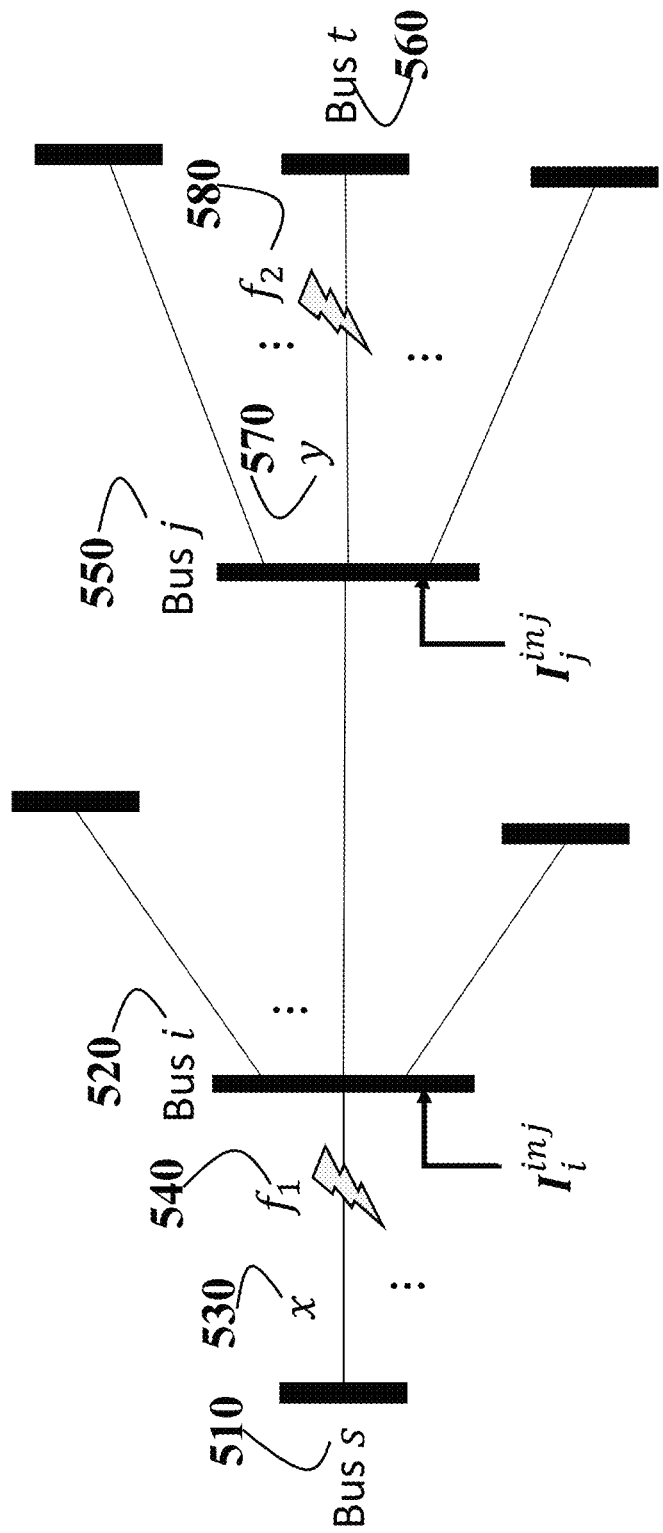
FIG. 5A is a schematic illustrating a portion of distribution system with two faults at non-adjacent sections, according to some embodiments of the present disclosure.
Figure 5B:
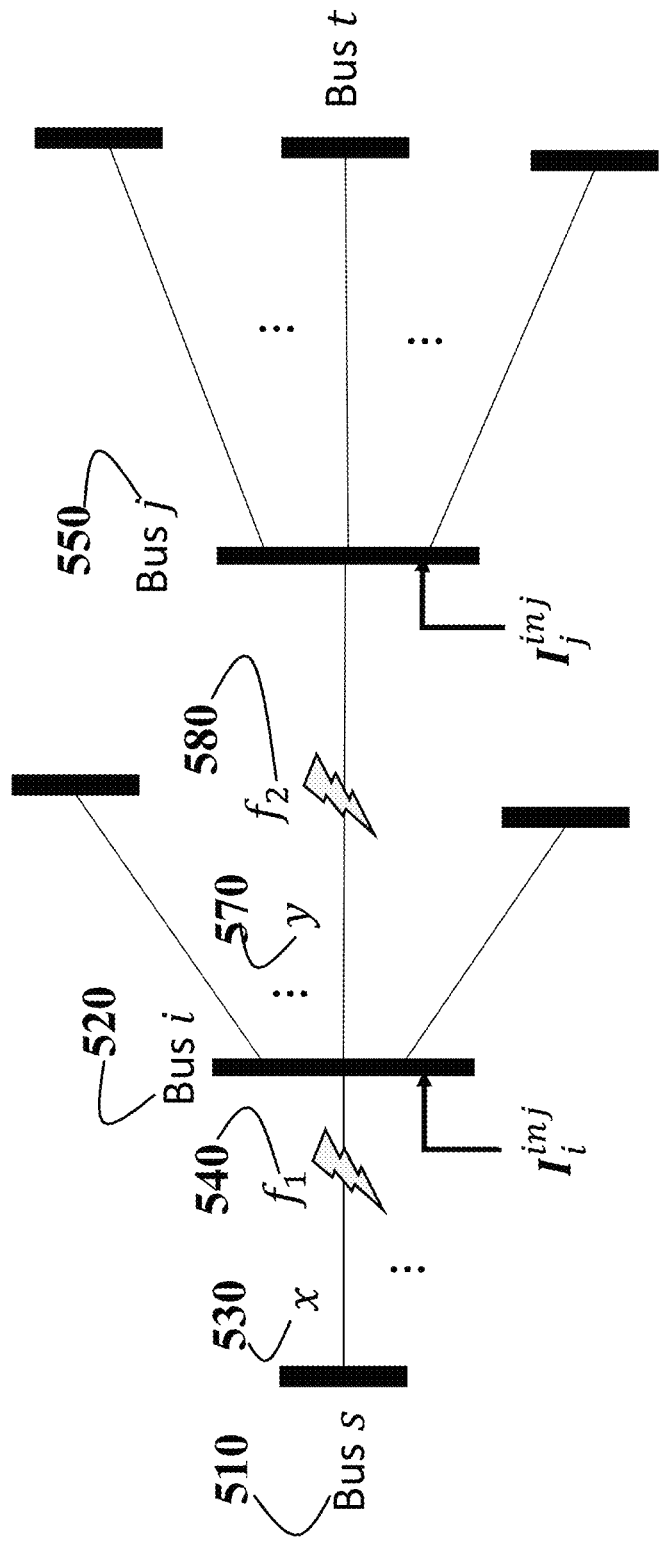
FIG. 5B is a schematic illustrating a portion of distribution system with two faults at adjacent sections, according to some embodiments of the present disclosure.

Depending on where the faults have occurred, two cases depicted in FIGS. 5A and 5B are discussed below.

FIG. 5A is a schematic illustrating a portion of distribution system with two faults $f_1$ 540 and $f_2$ 580 at non-adjacent sections, according to some embodiments of the present disclosure. In this case, the faulted sections are located at sections s–i and j–t. The fault locations are represented two ratios, x 530 and y 570, where x is the ratio of the length of section between fault $f_1$ to bus s over the total length of line section s–i, and y is the ratio of the length of section between fault $f_2$ to bus j over the total length of line section j–t. The faults $f_1$ 540 and $f_2$ 580 can be detected by checking whether there are non-zero phase current mismatches at critical terminal buses of line section between bus s 510 and bus i 520, and line section between bus j 550 and bus t 560. The critical terminal bus for a line section refers to its terminal bus that connects with more than one two-terminal sections. For example, for line section between bus s 510 and bus i 520, bus i connects with four different line sections, so bus i is a critical terminal bus for the line section s–i. However, bus s connects only one line section, so it is not a critical terminal bus for the line section s–i. Similarly, both bus j 550 and t 560 are the critical terminal buses for line section j–t. In other words, it can be determined that there are simultaneous faults $f_1$ and $f_2$ having occurred on sections s–i and j–t, when and only when the phase currents mismatches have been found on the critical terminal buses of sections s–i and j–t.

When the phase injection currents are measured, the phase current mismatches of a terminal bus of the line section are determined as the differences between the measured phase injection currents at the terminal bus and the derived phase injection currents at the bus. The derived phase injection currents are determined as a negative summation of derived phase line currents from all two-terminal sections that connected to the bus. The derived phase line currents of each two-terminal section are determined using phase voltages of terminal buses of the two-terminal section and series impedance and shunt admittance of the two-terminal section under the pre-fault topology. For example, sections s–i and j–t are determined as faulted sections when $\Delta I_i^\phi > 0$, $\forall \phi \in \Phi_{si}$, and $\Delta I_j^\phi > 0$, $\Delta I_t^\phi > 0$, $\forall \phi \in \Phi_{jt}$. The phase injection current mismatch for buses s, i, j and t, $\Delta I_s^\phi$, $\Delta I_i^\phi$, $\Delta I_j^\phi$ and $\Delta I_t^\phi$ are determined as difference between the measured phase injection currents at the buses, $I_s^\phi$, $I_i^\phi$, $I_j^\phi$ and $I_t^\phi$ and the derived phase injection currents $I_s^{\phi-0}$, $I_i^{\phi-0}$, $I_j^{\phi-0}$ and $I_t^{\phi-0}$ calculated from the connected line sections using phase voltage measurements and assuming non-fault conditions on the connected line sections.

When the phase line currents are measured, the phase current mismatches of a terminal bus of the line section are determined as the difference between the measured phase line currents at the terminal bus and the derived phase line currents at the bus. The derived phase line currents are determined using phase voltages of terminal buses of the line section and series impedance and shunt admittance of the section under the pre-fault topology. For example, sections s–i and j–t are determined as faulted sections when $\Delta I_{is}^\phi > 0$, $\forall \phi \in \Phi_{si}$, and $\Delta I_{jt}^\phi > 0$, $\Delta I_{tj}^\phi > 0$, $\forall \phi \in \Phi_{jt}$. The phase line current mismatch for buses i, j and t, $\Delta I_{is}^\phi$, $\Delta I_{jt}^\phi$ and $\Delta I_{tj}^\phi$ are determined as difference between the measured phase line currents at the buses, $I_{is}^\phi$, $I_{jt}^\phi$ and $I_{tj}^\phi$; and the derived phase line currents $I_{is}^{\phi-0}$, $I_{jt}^{\phi-0}$ and $I_{tj}^{\phi-0}$ calculated from the connected line sections using phase voltage measurements and assuming non-fault conditions on the connected line sections.

FIG. 5B is a schematic illustrating a portion of distribution system with two faults $f_1$ 540 and $f_2$ 580 at adjacent sections, according to some embodiments of the present disclosure. In this case, the faulted sections are located at sections s–i and i–j. The fault locations are represented two ratios, x 530 and y 570, x is the ratio of the length of section between fault $f_1$ to bus s over the total length of line section s–i, and y is the ratio of the length of section between fault $f_2$ to bus j over the total length of line section j–t. The faults $f_1$ 540 and $f_2$ 580 can be detected by checking whether there are non-zero phase current mismatches at critical terminal buses of line section between bus s 510 and bus i 520, and line section between bus j 550 and bus t 560. When the phase injection currents are measured, the simultaneous faults on sections s–i and i–j are determined when and only when $\Delta I_i^\phi > 0$, $\forall \phi \in \Phi_{si}$, and $\Delta I_i^\phi > 0$, $\Delta I_j^\phi > 0$, $\forall \phi \in \Phi_{ij}$. When the phase line currents are measured, the simultaneous faults on sections s–i and i–j can be determined when and only when $\Delta I_{is}^\phi > 0$, $\forall \phi \in \Phi_{si}$, and $\Delta I_{ij}^\phi > 0$, $\Delta I_{ji}^\phi > 0$, $\forall^{SM} \in \Phi_{ij}$.

It is noted that the above equations are derived based on assumption that the phase voltage measurements are available for all buses. This assumption does not hold, when there are secondary buses existing in the system. For such case, we have to estimate the voltages for unmeasured secondary buses according to the measurements of neighboring buses' of the bus under study. We use the measured voltages of neighboring buses of the unmeasured bus to initially set the voltage values of unmeasured bus; and then if needed, use the measured currents coining from neighboring buses of the said bus to refine the voltage values of the said bus.

Figure 6A:
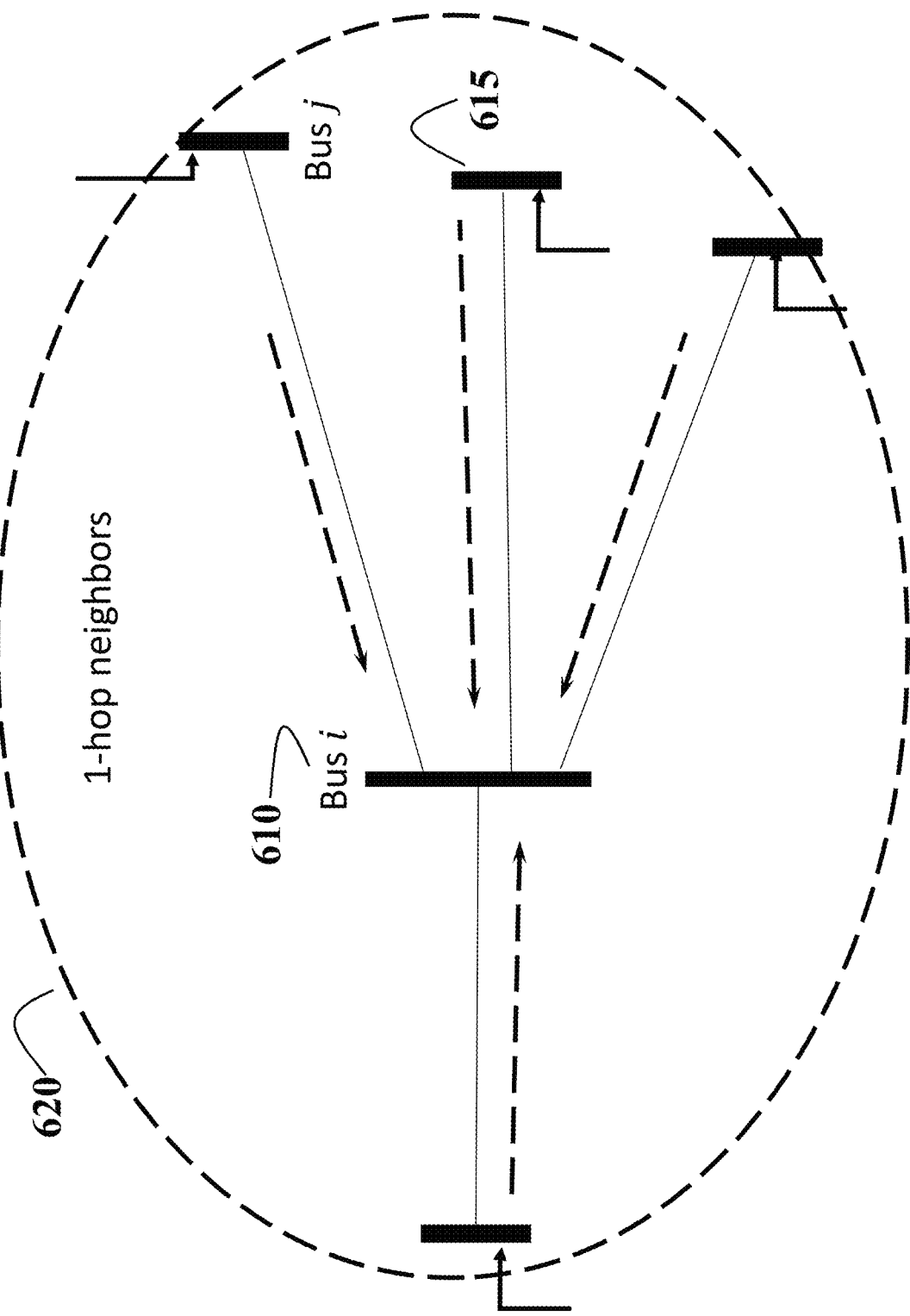
FIG. 6A is a schematic illustrating a bus and its 1-hop neighbors, according to some embodiments of the present disclosure.

For an unmeasured bus 610, when all of its 1-hop neighbors 620 are measured as shown in FIG. 6A, its voltage can be initially set based on voltages of those neighbors by assuming all connected lines are healthy according to:

$$V_i = \left[\sum_{j \in N(i)} \left(Y_{ij}^{se} + \frac{Y_{ij}^{sh}}{2}\right)\right]^{-1} \left(\sum_{j \in N(i)} Y_{ij}^{se} V_j\right) \quad (23)$$

where N(i) is the set of immediate buses 615 that directly connected with bus i.

Figure 6B:
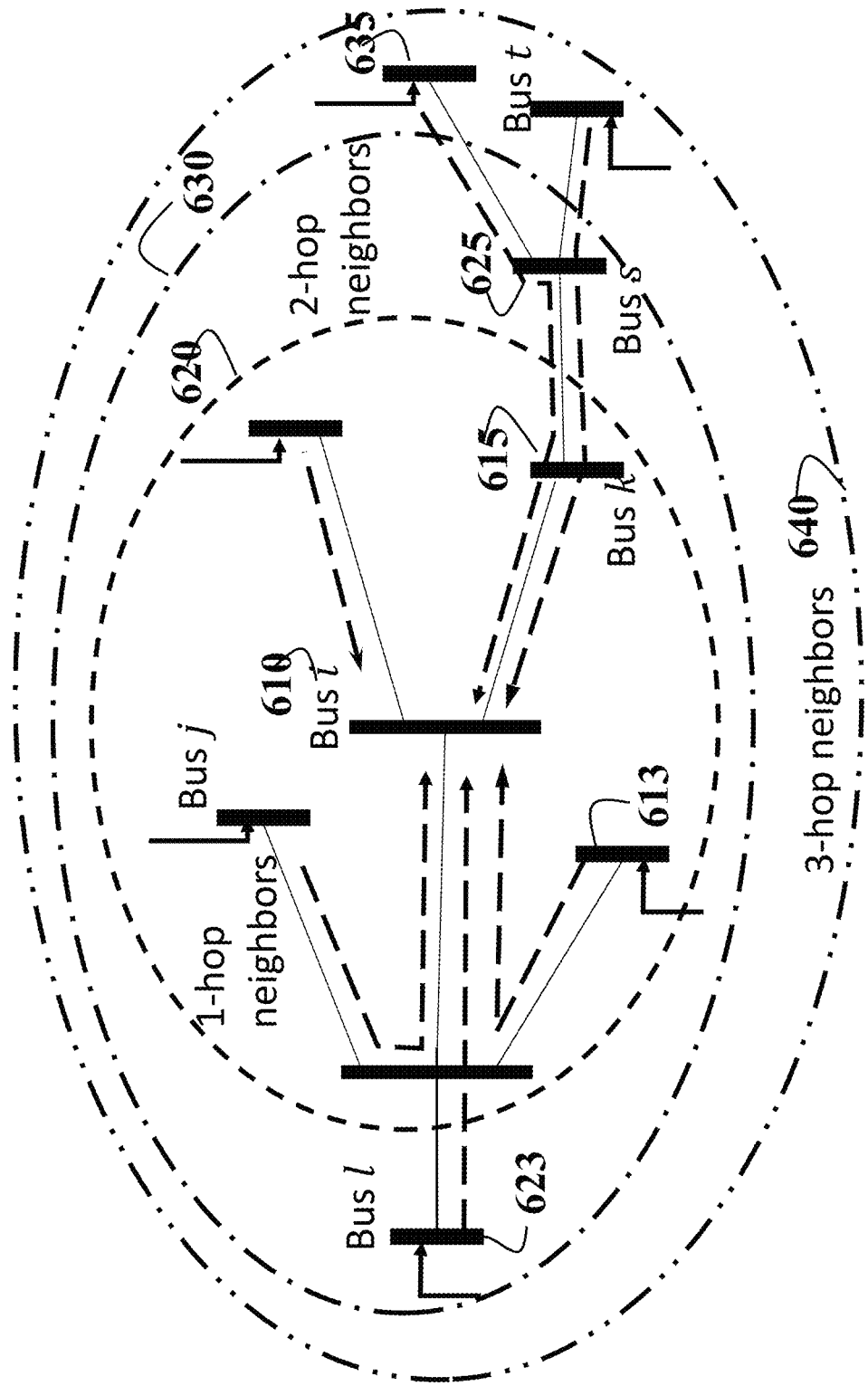
FIG. 6B is a schematic illustrating a bus and its neighbors within 3 hops, according to some embodiments of the present disclosure.

If not all of its 1-hop neighbors are measured as shown in FIG. 6B, farther neighbors are needed. For a practical system, the farthest neighbors that may be used are within 3 hops. Under such situation, we can determine the unmeasured bus's voltage based on a set of bus current balances as follows:

$$V_i = \quad (24a)$$

$$\left[\sum_{j \in N^{1M}(i) \cup N^{1U}(i)} \left(Y_{ij}^{se} + \frac{Y_{ij}^{sh}}{2}\right)\right]^{-1} \left(\sum_{j \in N^{1M}(i)} Y_{ij}^{se} V_j + \sum_{j' \in N^{1U}(i)} Y_{ij}^{se} V_{j'}\right)$$

$$V_{j'} = \left[\sum_{k \in N^{1M}(j') \cup N^{1U}(j')} \left(Y_{j'k}^{se} + \frac{Y_{j'k}^{sh}}{2}\right)\right]^{-1} \quad (24b)$$

$$\left(\sum_{k \in N^{1M}(j')} Y_{j'k}^{se} V_k + \sum_{k' \in N^{1U}(j), k' \neq i} Y_{j'k'}^{se} V_{k'} + Y_{ij}^{se} V_i\right), j' \in N^{1U}(i)$$

$$V_{k'} = \left[\sum_{l \in N^{1M}(k') \cup (j)} \left(Y_{k'l}^{se} + \frac{Y_{k'l}^{sh}}{2}\right)\right]^{-1} \quad (24c)$$

$$\left(\sum_{l \in N^{1M}(k')} Y_{k'l}^{se} V_l + V_l + Y_{j'k'}^{se} V_{j'}\right), k' \in N^{1U}(j'), j' \in N^{1U}(i)$$

where, $N^{1M}(i)$ 613 and $N^{1U}(i)$ 615 are the set of measured and unmeasured 1-hop neighbors of bus i 610. $N^{1M}(j)$ 623 and $N^{1U}(j)$ 625 are the set of measured and unmeasured 1-hop neighbors of bus j, i.e. the ones of 2-hop neighbors 630 of bus i if bus j is 1-hop neighbor of bus i. $N^{1M}(k)$ 635 is the set of measured 1-hop neighbors of bus k, i.e. the ones of 3-hop neighbors 640 of bus i if bus k is 2-hop neighbor of bus i.

Integrating (24a)-(24c) together, the voltages can be determined as a weighted summation of its measured 1-hop, 2-hop and 3-hop neighbors, 620, 630 and 640 according to:

$$V_i = \sum_{j \in N^{1M}(i)} W_{i-j} V_j + \sum_{j' \in N^{1U}(i)} \sum_{k \in N^{1M}(j')} W_{i-j'-k} V_k + \sum_{j' \in N^{1U}(i)} \sum_{k' \in N^{1U}(j), k' \neq i} \sum_{l \in N^{1M}(k')} W_{i-j'-k'-l} V_l \quad (25)$$

where, $$W_{i-j} = H_i D_i Y_{ij}^{se}, \quad W_{i-j'-k} = H_i D_i Y_{ij}^{se} G_{j'} E_{j'} Y_{j'k}^{se},$$

$$W_{i-j'-k'-l} = H_i D_i Y_{ij}^{se} G_{j'} E_{j'} Y_{j'k'}^{se} F_{k'} Y_{k'l}^{se},$$

$$D_i = \left[\sum_{j \in N^1(i)} \left(Y_{ij}^{se} + \frac{Y_{ij}^{sh}}{2}\right)\right]^{-1}, \quad E_{j'} = \left[\sum_{k \in N^1(j')} \left(Y_{j'k}^{se} + \frac{Y_{j'k}^{sh}}{2}\right)\right]^{-1},$$

$$F_{k'} = \left[\sum_{l \in N^1(k') \cup (j)} \left(Y_{k'l}^{se} + \frac{Y_{k'l}^{sh}}{2}\right)\right]^{-1},$$

$$G_{j'} = \left(I - \sum_{k' \in N^{1U}(j), k' \neq i} E_{j'} Y_{j'k'}^{se} F_{k'} Y_{j'k'}^{se}\right)^{-1}, \text{ and}$$

$$H_i = \left(I - \sum_{j' \in N^{1U}(i)} D_i Y_{ij}^{se} G_{j'} E_{j'} Y_{ij}^{se}\right)^{-1}.$$

Similarly, if more than 3-hop neighbors are needed, we can use the same method to derive the correspond equation.

The accuracy for determining voltages of secondary buses, i.e. unmeasured buses is critical for correctly identify the faults and locate the faults. If the determined values deviate from the true values significantly, all lines connected with the bus will have significant current difference between the topology-based calculated currents and measurement-based calculated currents, and then all those lines may be determined as faulted ones. To this end, there is a need to correct the determined voltages based on measured currents if some fault-indicative information is available.

Assumed there is a health line between the unmeasured bus j and a measured bus i, the voltage at unmeasured bus j can be recalculated through any measured bus i which is directly connected to it, i.e. 1-hop neighbor. This is done by utilizing the current balance at bus i:

$$I_i = \sum_{j \in N(i)} \left(Y_{ij}^{se} + \frac{Y_{ij}^{sh}}{2}\right) V_i - \sum_{j \in N(i)} Y_{ij}^{se} V_j, \quad (26)$$

The voltage values can be derived as $$V_j = Z_{ij}^{se}\left[\sum_{j'\in N(i)}\left(Y_{ij'}^{se} + \frac{Y_{ij'}^{sh}}{2}\right)V_i - \sum_{j'\in(N(i)-j)} Y_{ij'}^{se}V_{j'} - I_i\right]. \quad (27)$$

General speaking, the phase voltages of a secondary bus can be determined based on measured phase voltages and currents at any neighboring primary bus that connected to the secondary bus through a path consisting of secondary buses.

If multiple neighboring primary buses exist, the phase voltages of a secondary bus are determined based on measured phase voltages and currents at one neighboring primary bus of neighboring primary buses that causes minimal number of buses connected to the secondary bus having phase current mismatches between measured values (measured phase currents) and derived values (derived phase currents) that are derived using the pre-fault topology 156 with the normal status parameters stored in the storage 154.

Simultaneous Fault Locating of Power Distribution System

Still taken double faults as example, different location approaches may be used according to the locations of faults. There are two possible cases. The first case is that two non-adjacent sections are faulted, and the second case is that two adjacent sections are faulted.

Faults on Non-Adjacent Sections

FIG. 5A shows a portion of distribution system with two faults at non-adjacent sections. As shown in FIG. 5A, one fault $f_1$ is occurring on the line section connecting bus s and bus i, and the other $f_2$ is on the line section connecting bus j and bus t. As two faults are located at non-adjacent sections, each fault can be located independently.

For example, the location x of fault $f_1$ on the line section connecting bus s and bus i can be determined by equating $V_{f1}$ between two subsections connected the fault point $f_1$ with two terminal buses of the line section according to:

$$V_s - xZ_{si}^{se}\left(I_{si} + \frac{xY_{si}^{sh}}{2}V_s\right) = V_i - (1-x)Z_{si}^{se}\left(I_{is} + \frac{(1-x)Y_{si}^{sh}}{2}V_i\right) \quad (28)$$

The fault locations x is defined as the valid solution of the quadratic equations:

$$A_1 x^2 + B_1 x + C_1 = 0, \quad (29)$$

and solved through minimizing the least square equation defined as:

$$J(x) = \Sigma_{\phi \in \Phi_{si}}\{[Re(A_1^\phi)x^2 + Re(B_1^\phi)x + Re(C_1^\phi)]^2 + [Im(A_1^\phi)x^2 + Im(B_1^\phi)x + Im(C_1^\phi)]^2\} \quad (30)$$

Where, $$A_1 = \frac{1}{2}Z_{si}^{se}Y_{si}^{sh}(V_s - V_i), \; B_1 = -Z_{si}^{se}(I_{si} + I_{is} + Y_{si}^{sh}V_i),$$

$$C_1 = -\left(V_s - V_i + Z_{si}^{se}I_{is} + \frac{1}{2}Z_{si}^{se}Y_{si}^{sh}V_i\right).$$

Similarly, the location y of fault $f_2$ on the line section connecting bus j and bus t can be determined by equating $V_{f2}$ between two subsections connected the fault point $f_2$ with two terminal buses of the line section according to:

$$V_j - yZ_{jt}^{se}\left(I_{jt} + \frac{yY_{jt}^{sh}}{2}V_j\right) = V_t - (1-y)Z_{jt}^{se}\left(I_{tj} + \frac{(1-y)Y_{jt}^{sh}}{2}V_t\right) \quad (31)$$

The fault locations y is defined as the valid solution of the quadratic equations:

$$A_2 y^2 + B_2 y + C_2 = 0, \quad (32)$$

and solved through minimizing the least square equation defined as:

$$J(y) = \Sigma_{\phi \in \Phi_{jt}}\{[Re(A_2^\phi)y^2 + Re(B_2^\phi)y + Re(C_2^\phi)]^2 + [Im(A_2^\phi)y^2 + Im(B_2^\phi)y + Im(C_2^\phi)]^2\} \quad (33)$$

Where, $$A_2 = \frac{1}{2}Z_{jt}^{se}Y_{jt}^{sh}(V_j - V_t), \; B_2 = -Z_{jt}^{se}(I_{jt} + I_{tj} + Y_{jt}^{sh}V_t),$$

$$C_2 = -\left(V_j - V_t + Z_{jt}^{se}I_{tj} + \frac{1}{2}Z_{jt}^{se}Y_{jt}^{sh}V_t\right).$$

Faults on Adjacent Sections

FIG. 5B shows a portion of distribution system with two faults at adjacent sections. As shown in FIG. 5B, one fault $f_1$ 540 is occurring on the line section connecting bus s 510 and bus i 520, and the other $f_2$ 580 is on the line section connecting bus i 520 and bus j 550. Two faulted sections share a common middle bus, bus i 520. As two faults are located at adjacent sections, the fault locations have to be determined jointly.

When the measurements are available at the middle bus i, the faulty locations can be determined using the following equations:

$$V_s - xZ_{si}^{se}\left(I_{si} + \frac{xY_{si}^{sh}}{2}V_s\right) = V_i - (1-x)Z_{si}^{se}\left(I_{is} + \frac{(1-x)Y_{si}^{sh}}{2}V_i\right) \quad (34)$$

$$V_i - yZ_{ij}^{se}\left(I_{ij} + \frac{yY_{ij}^{sh}}{2}V_i\right) = V_j - (1-y)Z_{ij}^{se}\left(I_{ji} + \frac{(1-y)Y_{ij}^{sh}}{2}V_j\right) \quad (35)$$

$$I_{is} + I_{ij} = I_i - \sum_{k \in N^1(i)-\{s,j\}} I_{it}^0$$

Then we have:

$$x^2 y(Y_{si}^{sh}V_s - Y_{si}^{sh}V_i) + xy^2(Y_{si}^{sh}V_i - Y_{si}^{sh} - V_j) + xy(2I_{si} + 2Y_{si}^{sh}V_i + 2Y_{si}^{sh}V_j + 2I_{ji} + 2I_i - 2\Sigma_{k \in N^1(i)-\{s,j\}}I_{it}^0) + y^2(Y_{si}^{sh}V_j - Y_{si}^{sh}V_i) + x(-2Y_{ij}^{se}V_i + 2Y_{ij}^{se}V_j - 2I_{ji} - Y_{ij}^{sh}V_j) + y(2Y_{si}^{se}V_i - 2Y_{si}^{se}V_s - Y_{si}^{sh}V_i - 2I_{ji} - 2Y_{ij}^{sh}V_j - 2I_i + \Sigma_{k \in N^1(i)-\{s,j\}}I_{it}^0) + (2Y_{ij}^{se}V_i - 2Y_{ij}^{se}V_j + 2I_{ji} + Y_{ij}^{sh}V_j) = 0 \quad (36)$$

It can be simplified as:

$$Ax^2 y + Bxy^2 + Cxy + Dy^2 + Ex + Fy + G = 0 \quad (37)$$

Where, $A = Y_{si}^{sh}V_s - Y_{si}^{sh}V_i$, $B = Y_{ij}^{sh}V_i - Y_{ij}^{sh}V_j$, $C = 2I_{si} + 2Y_{si}^{sh}V_i + 2Y_{ij}^{sh}V_j + 2I_{ji} + 2I_i - 2\Sigma_{k \in N^1(i)-\{s,j\}}I_{it}^0$, $D = Y_{ij}^{sh}V_j - Y_{ij}^{sh}V_i$, $E = -2Y_{ij}^{se}V_i + 2Y_{ij}^{se}V_j - 2I_{ji} - Y_{ij}^{sh}V_j$, $F = 2Y_{si}^{se}V_i - 2Y_{si}^{se}V_s - Y_{si}^{sh}V_i - 2I_{ji} - 2Y_{ij}^{sh}V_j - 2I_i + 1\Sigma_{k \in N^1(i)-\{s,j\}}I_{it}^0$, $G = 2Y_{ij}^{se}V_i - 2Y_{ij}^{se}V_j + 2I_{ji} + Y_{ij}^{sh}V_j$.

As the equation parameters are vectors of complex numbers, (37) can be further divided into a set of equations defined using real and imaginary parts of parameters for each phase, respectively:

$$Re(A^\Phi)x^2y+Re(B^\Phi)xy^2+Re(C^\Phi)xy+Re(D^\Phi)y^2+Re(E^\Phi)x+Re(F^\Phi)y+Re(G^\Phi)=0, \phi\in\Phi_{si}\cap\Phi_{ij} \quad (38a)$$

$$Im(A^\Phi)x^2y+Im(B^\Phi)xy^2+Im(C^\Phi)xy+Im(D^\Phi)y^2+Im(E^\Phi)x+Im(F^\Phi)y+Im(G^\Phi)=0, \phi\in\Phi_{si}\cap\Phi_{ij} \quad (38b)$$

Each of (38a) and (38b) can be solved separately. However, we may get conflict solutions from different equations. Therefore, instead of solving above equations individually, we replace the above problem by finding a solution that minimize the following least square equation:

$$J(x,y)=\Sigma_{\phi\in\phi_{ij}}\{[Re(A^\Phi)x^2y+Re(B^\Phi)xy^2+Re(C^\Phi)xy+Re(D^\Phi)y^2+Re(E^\Phi)x+Re(F^\Phi)y+Re(G^\Phi)]^2+[Im(A^\Phi)x^2y+Im(B^\Phi)xy^2+Im(C^\Phi)xy+Im(D^\Phi)y^2++Im(F^\Phi)y+Im(G^\Phi)]^2\} \quad (39)$$

Its solution can be iteratively solved using the following equation:

$$x_{n+1} = x_n - \frac{J(x_n, y_n)}{\frac{\partial J(x_n, y_n)}{\partial x}} \quad (40a)$$

$$y_{n+1} = y_n - \frac{J(x_n, y_n)}{\frac{\partial J(x_n, y_n)}{\partial y}} \quad (40b)$$

Where, $x_n$, $y_n$ and $x_{n+1}$, $y_{n+1}$ are x and y values calculated at iterations n and n+1. $J(x_n, y_n)$ and $$\frac{\partial J(x_n, y_n)}{\partial x}$$

are least square value and derivative of least square over x, y calculated using $x_n$, $y_n$.

If measurements are not available at the middle bus i, we can set the current measurement at the bus as zero if it is a secondary bus, or normal values if it is a primary bus, and using above equations to get the fault location estimation.

Algorithm for Detecting and Locating of Simultaneous Faults in Power Distribution Systems The disclosed algorithm can be described using the following steps:

Step 1: Set a pre-defined lower bound for magnitudes of phase current mismatches ΔI, ζ, and a predefined time between two fault detections, Δt.
Step 2: Set time t=0;
Step 3: Set the phase voltages and currents of primary buses, $U^{pri}$ and $I^{pri}$ using the measured phase voltages and currents at primary buses at time t, $U^{meas}(t)$, and $I^{meas}(t)$.
Step 4: determine phase voltages of secondary buses $U^{sec}$ using phase voltages at neighboring primary buses and using pre-fault normal topology.
Step 5: determine (compute) phase current mismatches ΔI between measured values (phase currents) and calculated values (phase currents) using normal topology that used for fault detection.
Step 6: check whether |ΔI|≤ζ (for all phases of each bus in the distribution system. If yes, set t=t+Δt, go to step 3. Otherwise, go to step 7.
Step 7: Check whether multiple sections connected to secondary buses are faulted. If yes, correcting $U^{sec}$ using phase voltages and currents at neighboring primary buses.
Step 8: Check whether faults are on adjacent sections. If yes, determine the fault locations using least square method jointly. Otherwise, determine the fault locations using least square method individually.
Step 9: output the determined fault locations.

Example

Figure 7:
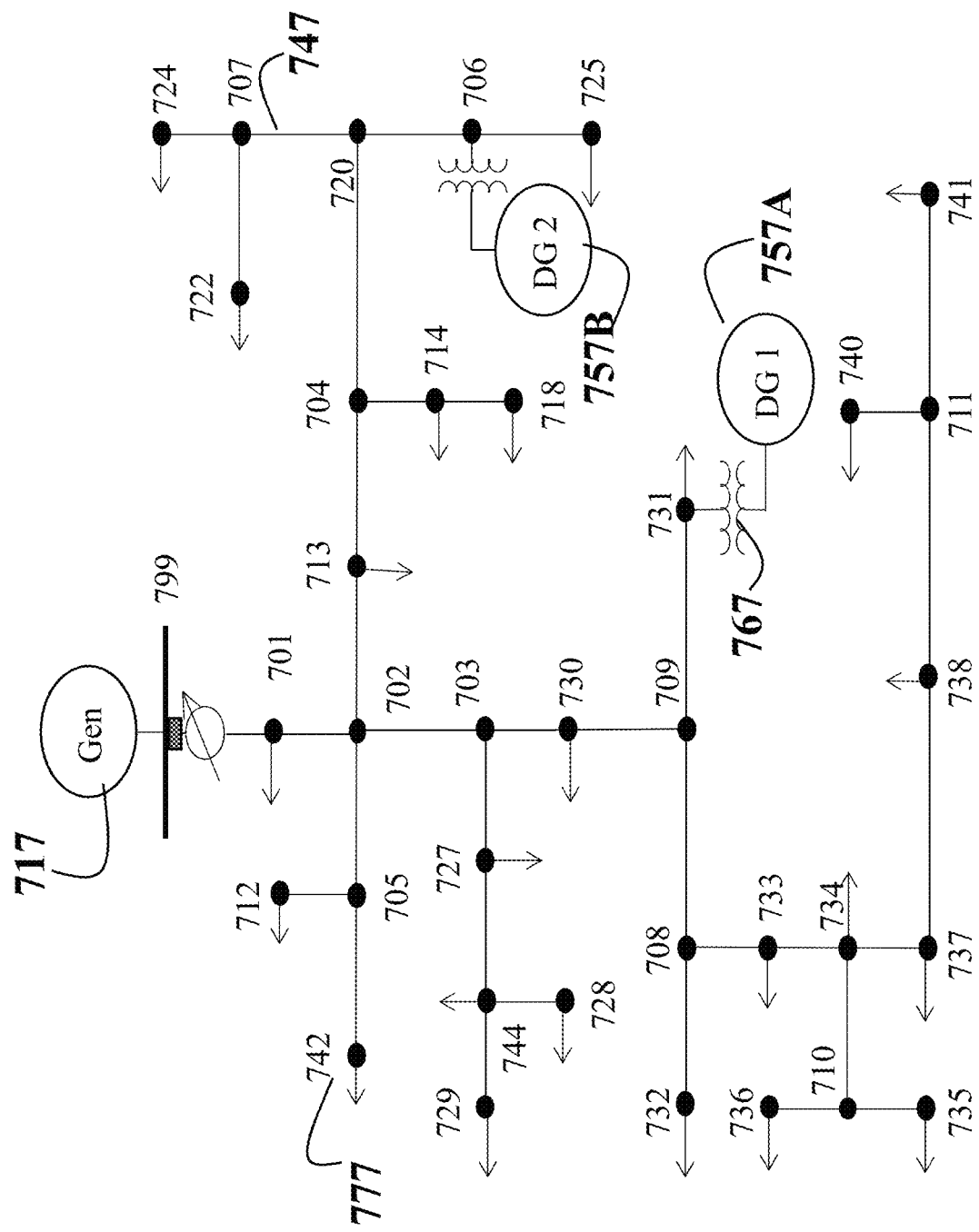
FIG. 7 is a schematic illustrating a 36-bus distribution feeder, according to some embodiments of the present disclosure.
Figure 8A:
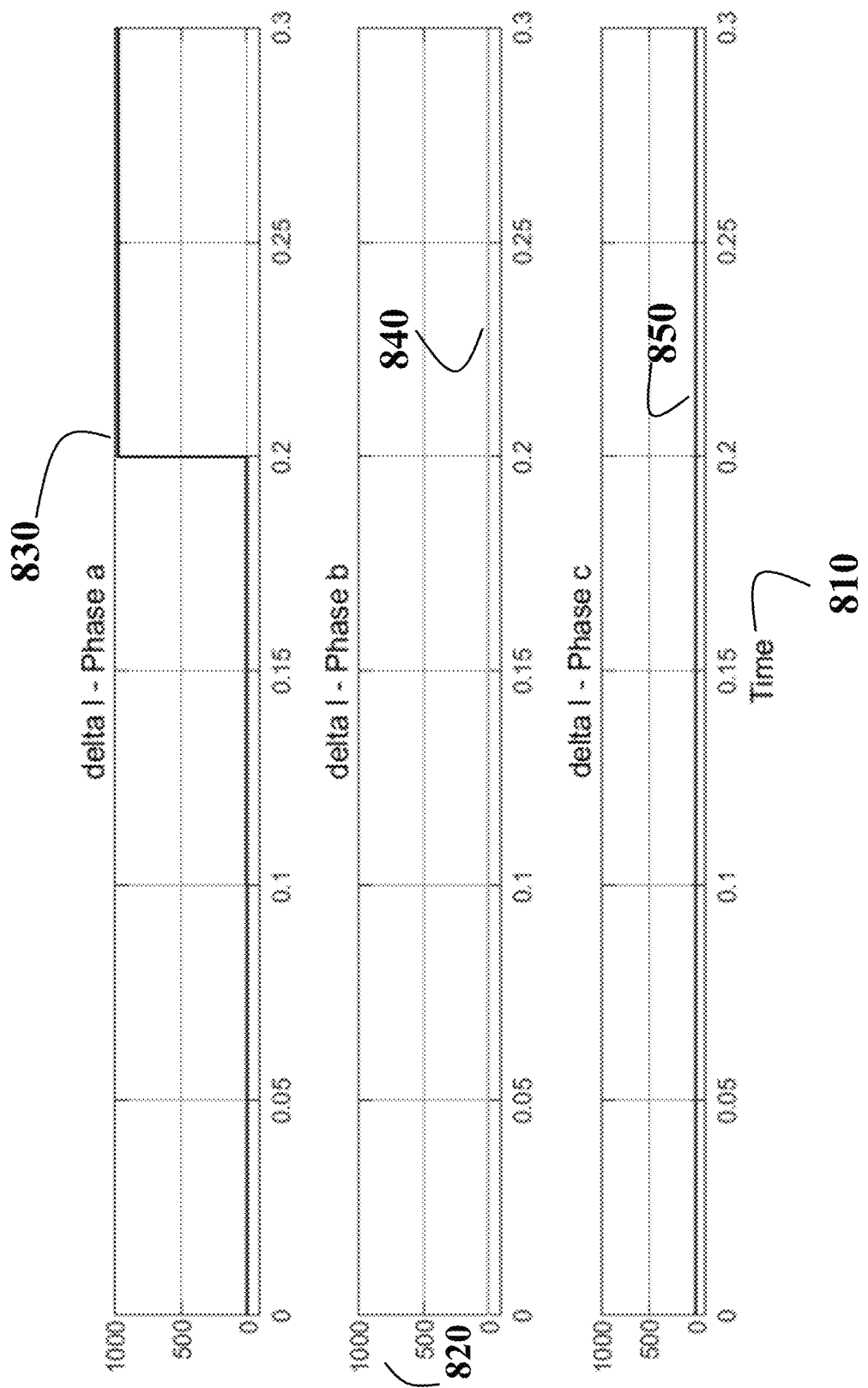
FIG. 8A is a graph illustrating the current mismatches at bus 727, according to some embodiments of the present disclosure.
Figure 8B:
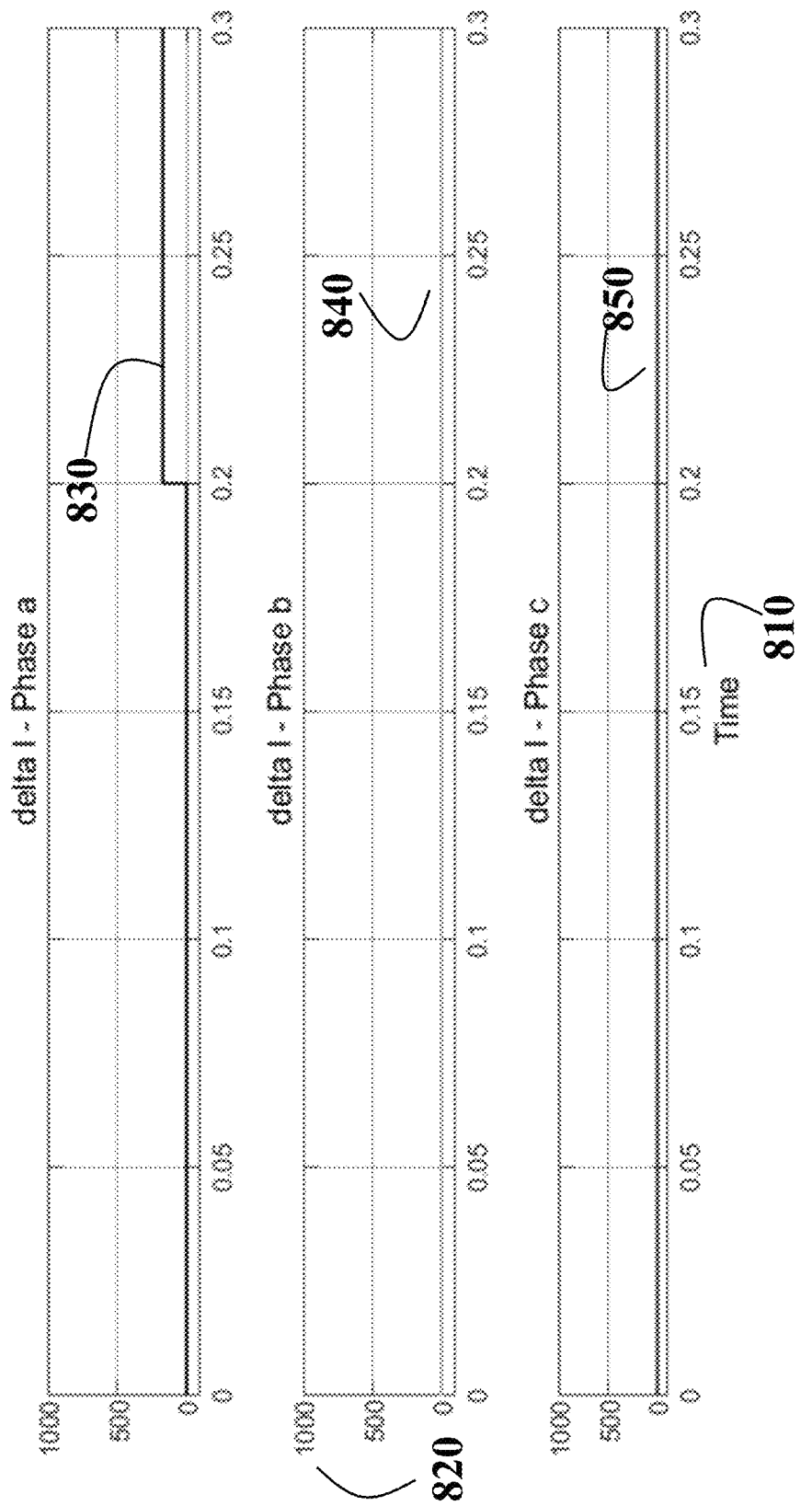
FIG. 8B is a graph illustrating the current mismatches at bus 744, according to some embodiments of the present disclosure.
Figure 8C:
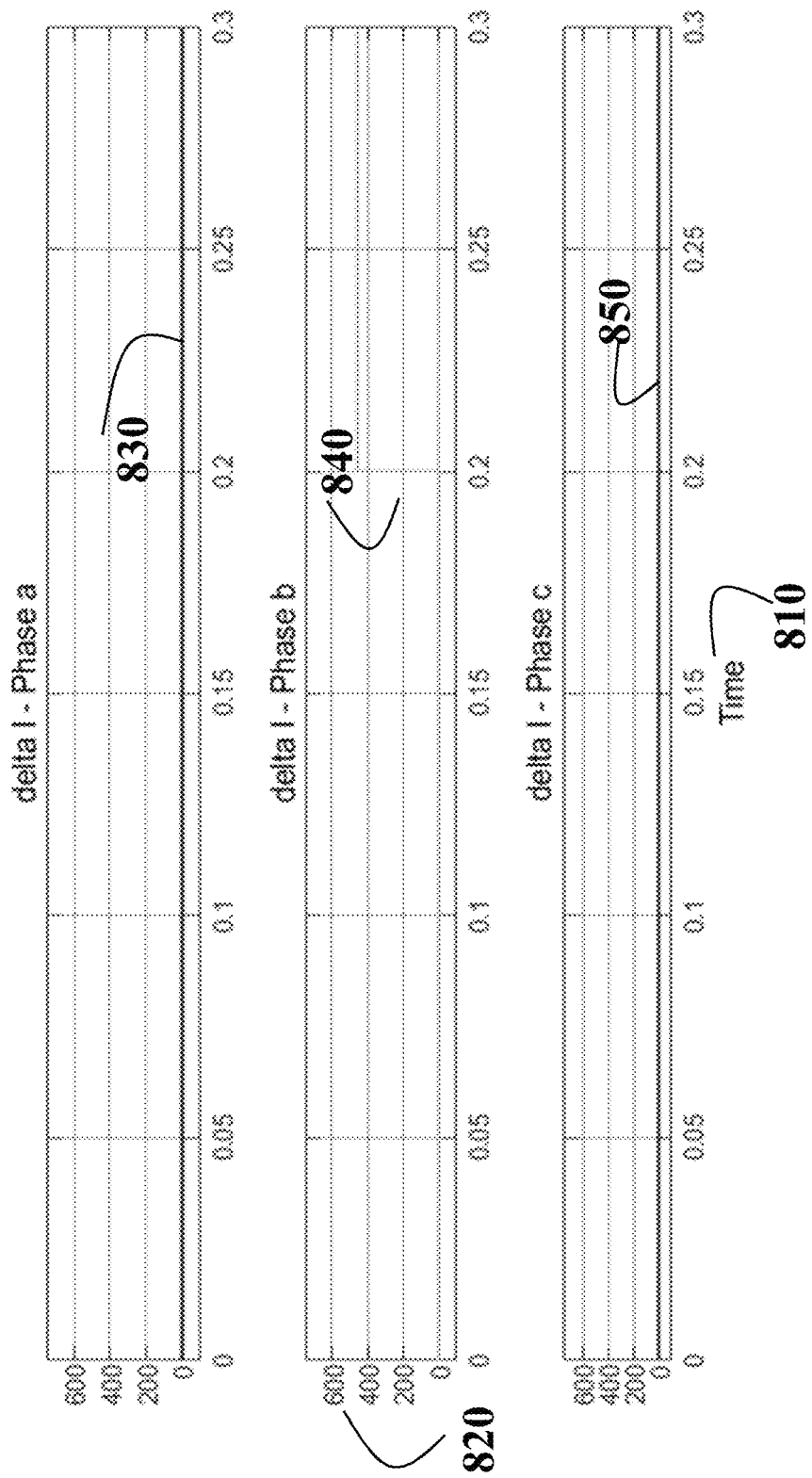
FIG. 8C is a graph illustrating the current mismatches at bus 711, according to some embodiments of the present disclosure.
Figure 8D:
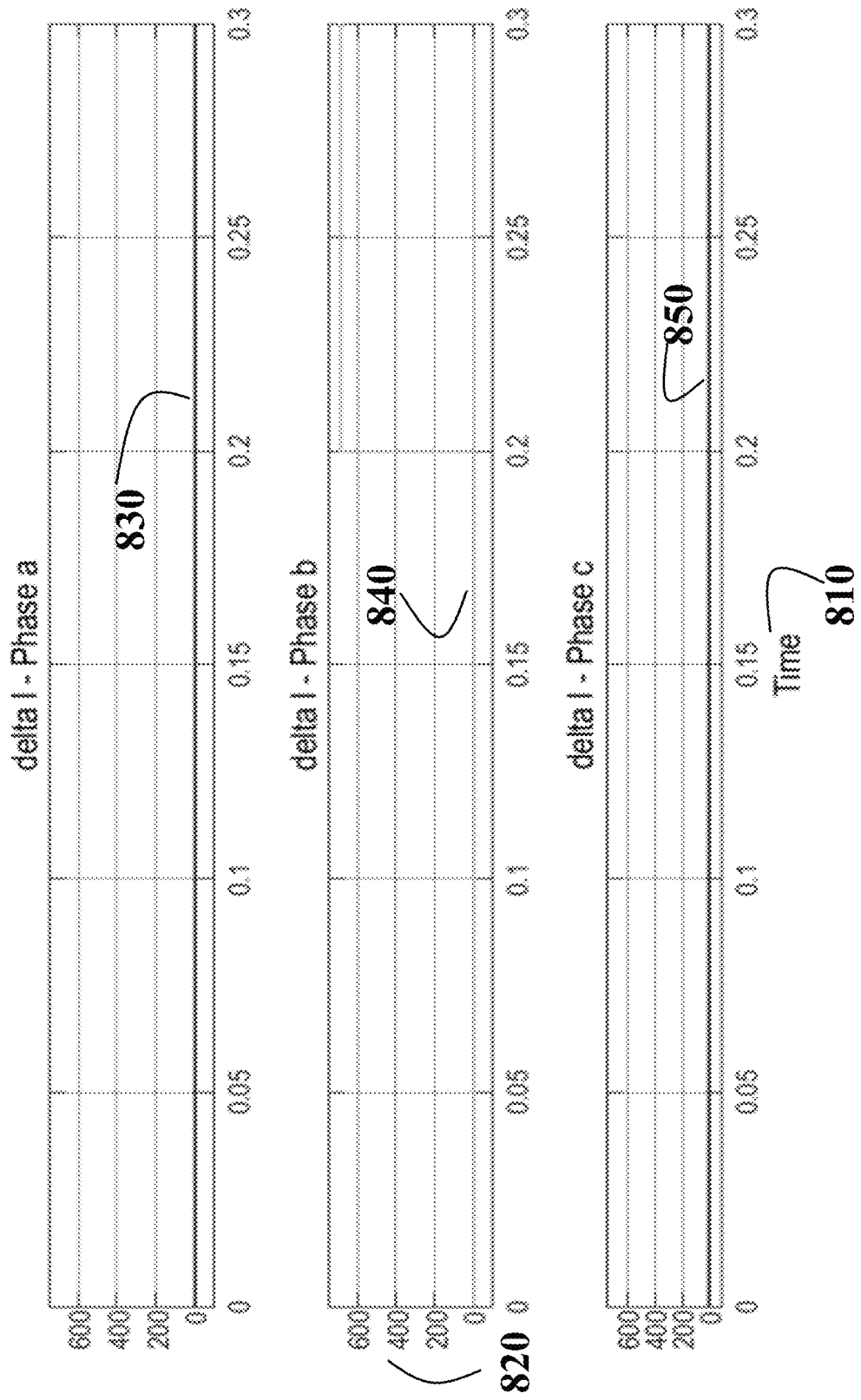
FIG. 8D is a graph illustrating the current mismatches at bus 740, according to some embodiments of the present disclosure.
Figure 9A:
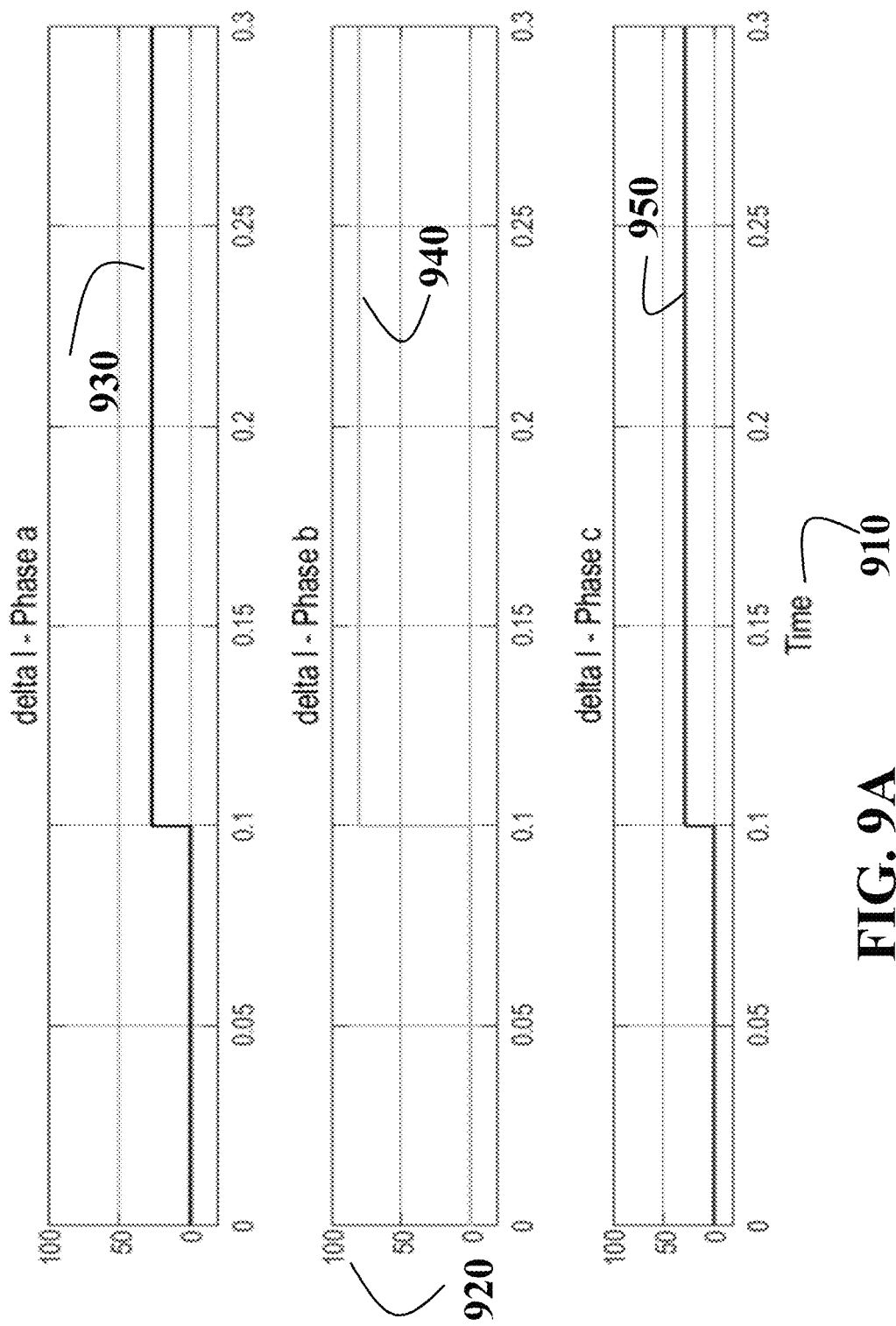
FIG. 9A is a graph illustrating the current mismatches at bus 707, according to some embodiments of the present disclosure.
Figure 9B:
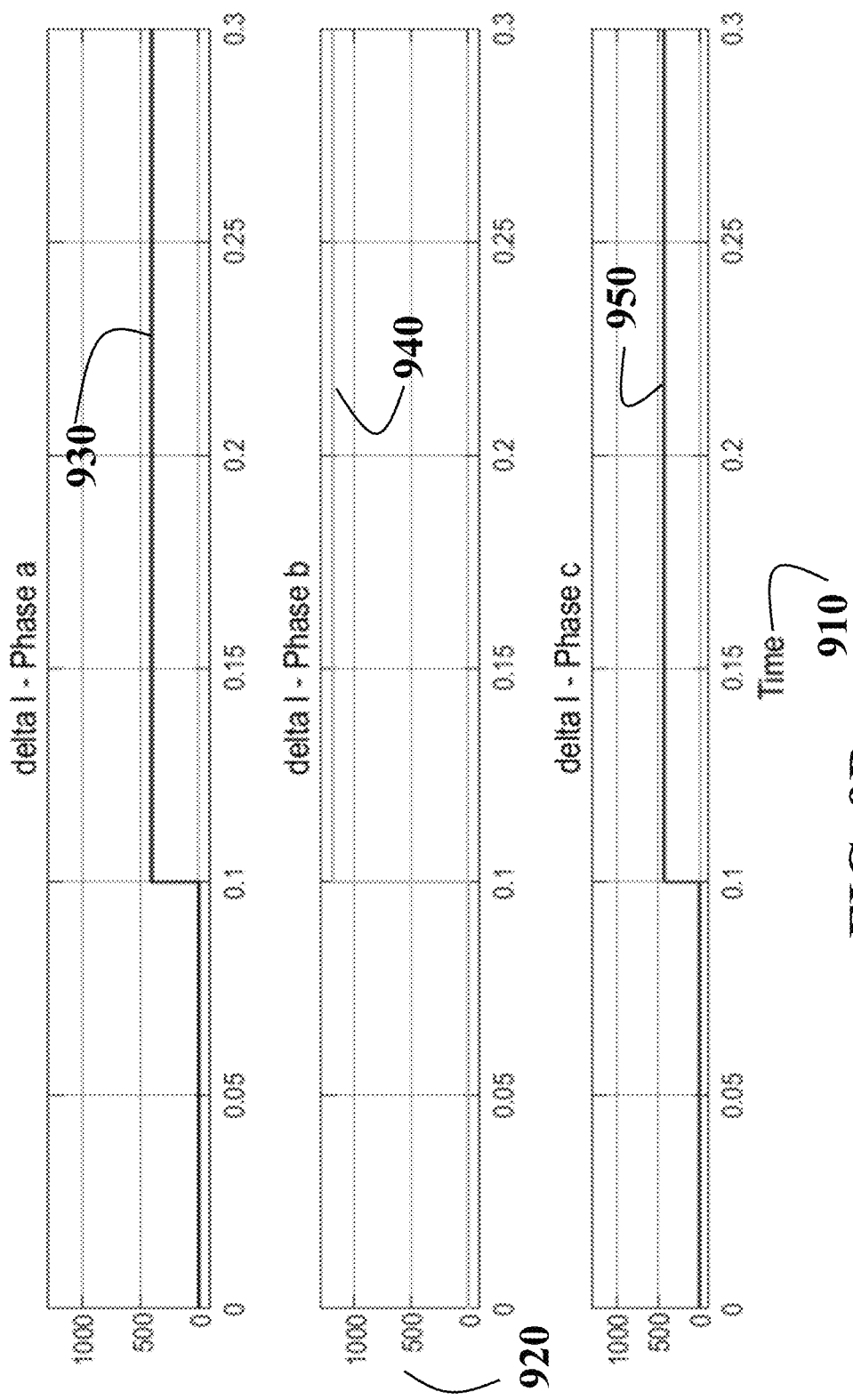
FIG. 9B is a graph illustrating the current mismatches at bus 722, according to some embodiments of the present disclosure.
Figure 9C:
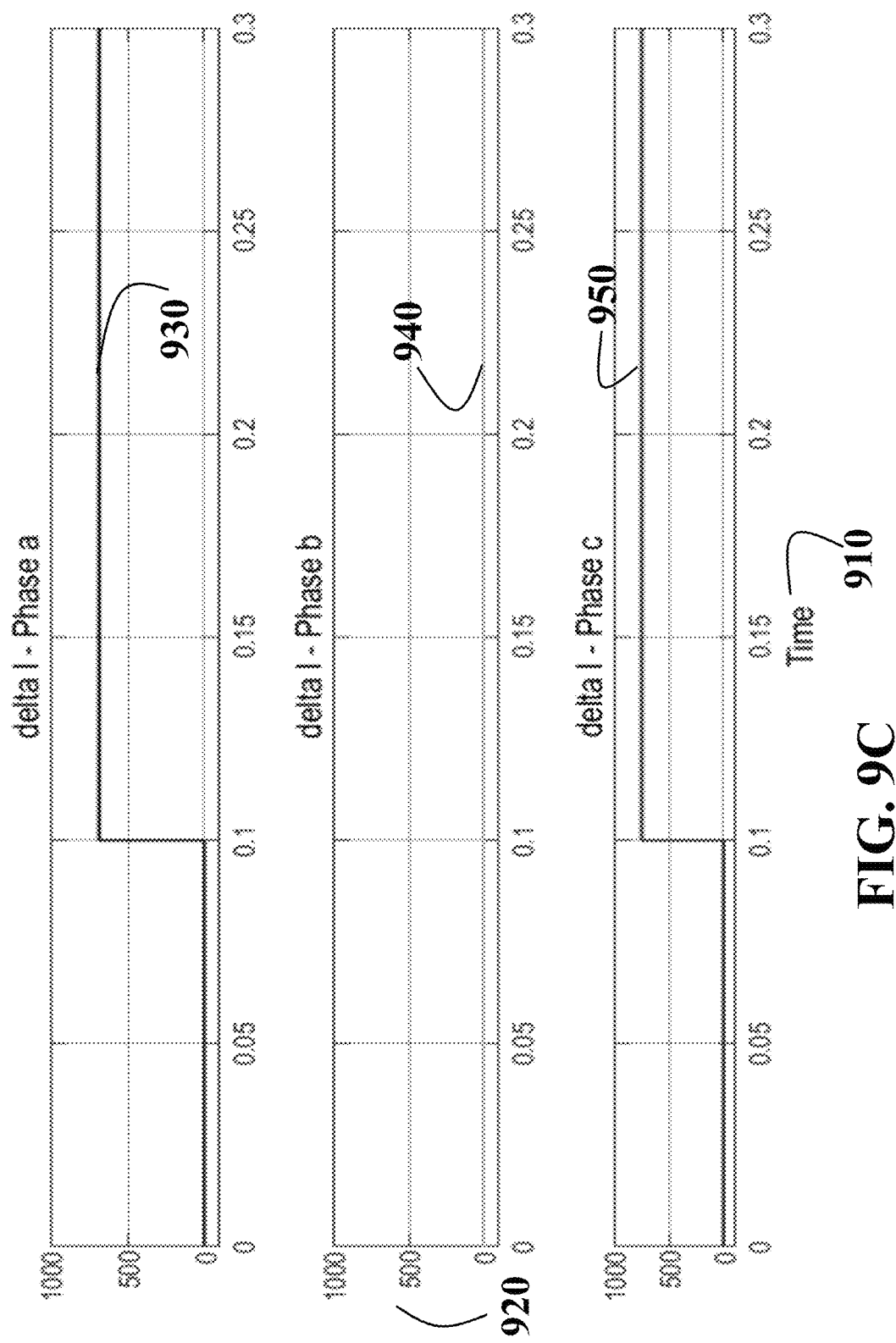
FIG. 9C is a graph illustrating the current mismatches at bus 709, according to some embodiments of the present disclosure.
Figure 9D:
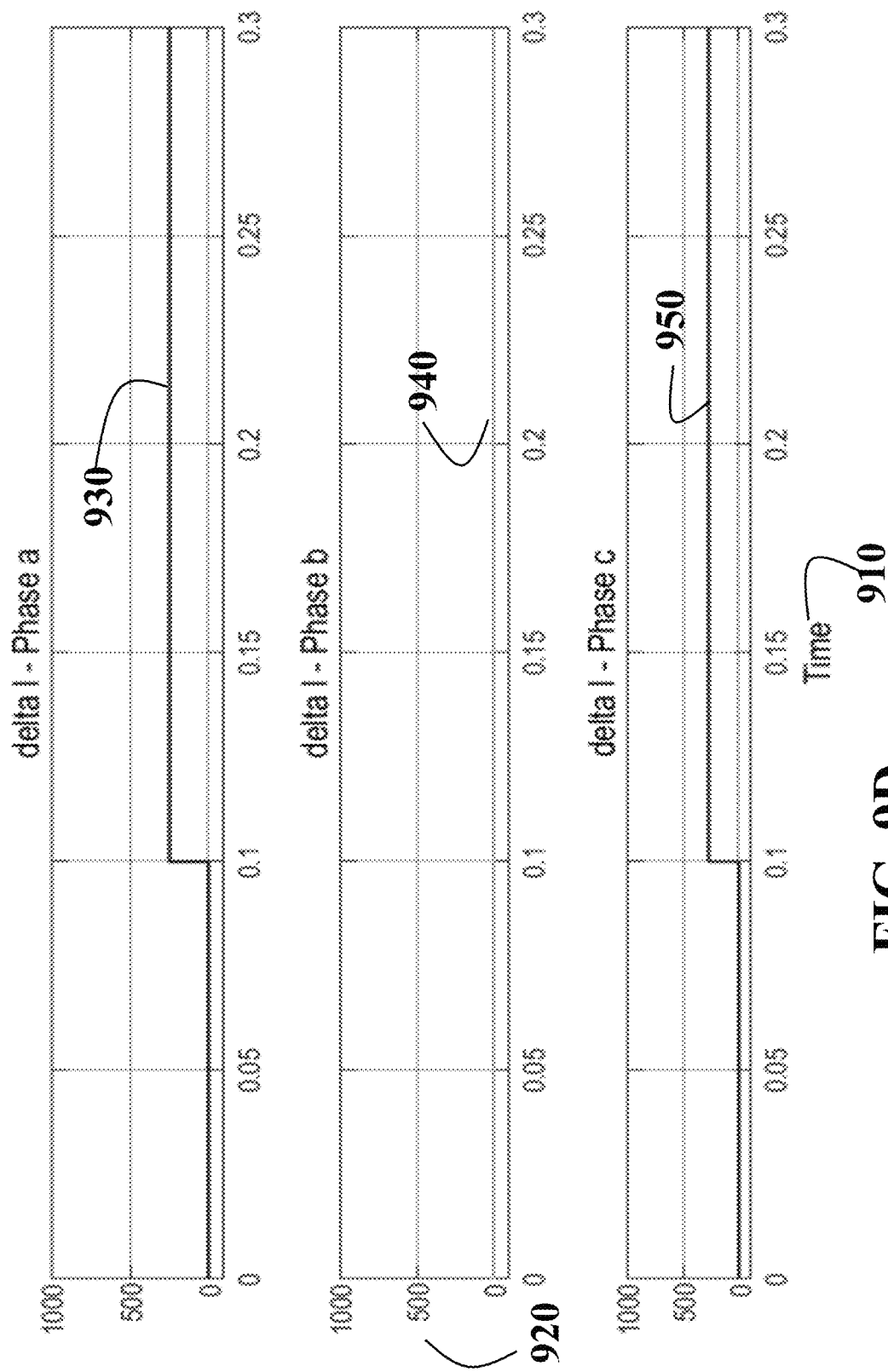
FIG. 9D is a graph illustrating the current mismatches at bus 708, according to some embodiments of the present disclosure.

FIG. 7 is a 36-bus sample system with a 4.8 kV operating voltage. It shows the one-line diagram for the sample system. The system includes a swing generator 717, denoted Gen, is attached to bus 799, a PQ distributed generator, denoted DG 1, 757A is attached to bus 731, and a PV distributed generator, denoted DG 2, 757B is attached to bus 706. The entire network is ungrounded, as all loads 777 are ungrounded, and all generators 717, 757A and 757B are connected with transformers or voltage regulators from the network using Wye/Delta connection, 767. All line sections 747 are of three-phase.

The first example simulates two ground faults occurred at different times. The first fault is a phase a to ground fault occurred at section 744-727 at point 0.1500 (denoted x) at time 0.1 s, and the second fault is a phase b to ground fault occurred at section 711-740 at point 0.6000 (denoted y) at time 0.2 s. All buses 744, 727, 711 and 740 are equipped with current and voltage measuring units (not shown in the figure).

Fault detection is performed by observing the phase injection current mismatches of buses. FIGS. 8A, 8B, 8C and 8D give the value changes for all phases at buses 727, 744, 711 and 740, respectively. In the figures, the x-axis and y-axis present the elapsed time 810 and phase current mismatches 820. The sub-plots 830,840 and 850 represent the phase current mismatches on phase a, phase b and phase c, respectively. Table I also gives phase injection current mismatch values after the faults. Since the network is ungrounded, fault currents are of low values when one single phase to ground occurs, as shown in FIGS. 8A-8D at time t=0.1 s. Only when the second fault occurs, do the fault current values have significant values as shown in FIGS. 8A-8D at time t=0.2 s.

TABLE I

Phase injection current mismatches for the first example

|  | Bus 727 | Bus 744 | Bus 711 | Bus 740 |
|---|---|---|---|---|
| Phase a | 972.3603 | 171.5930 | 0.0005 | 0.0001 |
| Phase b | 0.0019 | 0.0013 | 457.3072 | 685.9604 |
| Phase c | 0.0103 | 0.0059 | 0.0164 | 0.0005 |

From this, it can be concluded that phase a is faulted at section 727-744 at time t=0.2 s, and the phase b is faulted at section 711-740 at time t=0.2 s. Since both faults are on primary sections, the procedure can continue with fault location. As both faults are at non-adjacent sections, their locations can be found separately as x=0.1499, and y=0.5999.

The second example simulates two ground faults, where one of the faults is on a line section that connected with a secondary bus. The first fault is a phase a to ground fault occurring at section 744-727 at point 0.8000 (denoted as x) at time 0.1 s, and the second one is a phase b to ground fault occurring at section 710-736 at point 0.7500 (denoted as y) at time 0.1 s. Buses 744, 727, and 736 are equipped with current and voltage measuring units, but bus 710 is not be measured. We first estimate the voltages at bus 710 based on the neighboring primary buses 734, 735 and 736 with assumption that not faults are occurring on the sections between those buses and bus 710. Then we can get phase current mismatches are shown in Table II. From this it can be concluded that Phase a is faulted at section 744-727 at time t=0.1 s, and Phase b is faulted at section 710-734, and 710-735 at time t=0.1 s. This can be concluded from the fact that phase current mismatches are affected at three connected buses from which one is a secondary bus. For the second fault, the voltage at bus 710 has to be correctly using another bus—in this case using bus 734 or 735. The corrected phase current mismatches are given in Table III. As both faults are at non-adjacent sections, their locations can be found separately as x=0.7999, and y=0.7499.

TABLE II

Original phase current mismatches for the second example

|  | Bus 744 | Bus 727 | Bus 710 | Bus 734 | Bus 735 |
|---|---|---|---|---|---|
| Phase a | 885.7183 | 221.4298 | 0.0018 | 0.0001 | 0.0001 |
| Phase b | 0.0023 | 0.0014 | 8455.7590 | 2042.0840 | 5307.2650 |
| Phase c | 0.0094 | 0.0071 | 0.0444 | 0.0017 | 0.0221 |

TABLE III

Corrected phase current mismatches for the second example

|  | Bus 710 | Bus 736 |
|---|---|---|
| Phase a | 0.0004 | 0.0001 |
| Phase b | 276.6034 | 829.8076 |
| Phase c | 0.0104 | 0.0035 |

The third example simulates two ground faults at the same phase in adjacent sections, one is a phase a to ground fault occurring at primary section 744-727 at point 0.1000 (denoted as x) at time 0.1 s, and the other is a phase a to ground fault occurring at primary section 727-703 at point 0.3500 (denoted as y) at time 0.1 s. All buses are primary buses. The phase current mismatches are given in Table IV. It can be concluded that phase a is faulted at sections 727-744 and 703-727 at time t=0.1 s.

TABLE IV

Phase injection current mismatches for the third example

|  | Bus 744 | Bus 727 | Bus 703 |
|---|---|---|---|
| Phase a | 2.8634 | 15.7527 | 18.7682 |
| Phase b | 0.0065 | 0.0122 | 0.0059 |
| Phase c | 0.0062 | 0.0117 | 0.0055 |

Since two adjacent sections have faults in the same phase, fault locations need to solve jointly. Two specific cases can occur, one is the measurements available at the middle bus 727, and the other is the measurements available at the middle bus 727 not available. For the first case, the calculated fault locations would be x=0.0999, and y=0.3499. For the second case, the calculated fault locations would be x=0.0844, and y=0.4781. It is noted that for the second case, due to voltages at bus 727 could not be corrected by primary buses, the accuracy of fault location might be affected by the fault conditions.

The fourth example simulates two short circuit faults, the first one is a phases a, b and c to ground fault occurring at primary section 707-722 at point 0.9370 (denoted as x) at time 0.1 s, and the second one is a phases a and c to ground fault occurring at primary section 709-708 at point 0.2660 (denoted as y) at time 0.1 s. All buses are measured. The variations of phase current mismatches with time for all phases at buses 707, 722, 709 and 708 are given in FIGS. 9A, 9B, 9C and 9D, respectively. In the figures, the x-axis and y-axis present the elapsed time 910 and phase currents 920. The sub-plots 930, 940 and 950 represent the phase currents on phase a, phase b and phase c, respectively. Phase current mismatches after the faults are also shown in Table V. Significant values can be observed after the faults occur at all corresponding buses and phases from the figures at time t=0.1 s.

From Table V, it can be concluded that phases a, b and c are faulted at section 707-722 at time t=0.1 s, and that phases a and c are faulted at section 709-708 at time t=0.1 s. Those faults are at non-adjacent sections, then their locations can be found separately. The fault locations are determined as x=0.9369, and y=0.2659.

TABLE V

Phase injection current mismatches for the fourth example

|  | Bus 707 | Bus 722 | Bus 709 | Bus 708 |
|---|---|---|---|---|
| Phase a | 27.1592 | 403.9365 | 683.8370 | 247.8210 |
| Phase b | 80.2217 | 1193.1310 | 0.0045 | 0.0027 |
| Phase c | 28.6230 | 425.7081 | 749.7206 | 271.6970 |

Other Examples

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Further, embodiments of the present disclosure and the functional operations described in this specification can be implemented in digital electronic circuitry, in tangibly-embodied computer software or firmware, in computer hardware, including the structures disclosed in this specification and their structural equivalents, or in combinations of one or more of them. Further some embodiments of the present disclosure can be implemented as one or more computer programs, i.e., one or more modules of computer program instructions encoded on a tangible non transitory program carrier for execution by, or to control the operation of, data processing apparatus. Further still, program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

According to embodiments of the present disclosure the term "data processing apparatus" can encompass all kinds of apparatus, devices, and machines for processing data, including by way of example a programmable processor, a computer, or multiple processors or computers.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network. Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A system for detecting and locating simultaneous faults in a distribution network having buses equipped with measurement units, the buses including primary and secondary buses connected with two-terminal sections, the system comprising:
    an interface to receive, from the measurement units every preset period of time, signals indicating measured three-phase voltages and three-phase currents of buses and corresponding locations of the buses in the distribution network via a communication network;
    a memory to store computer-executable programs including series impedances and shunt admittances of the two-terminal sections, a pre-fault connectivity topology of the distribution network and a fault detection program configured to detect simultaneous faults and identify locations of the simultaneous faults in the distribution network, and;
    at least one processor, in connection with the memory and the interface, to perform the fault detection program that comprises steps of:
        providing the series impedances and shunt admittances and the pre-fault connectivity topology;
        determining if simultaneous faults have occurred on line sections in the distribution network by computing phase current mismatches at terminal buses of the line sections using measured phase currents and derived phase currents, wherein the derived phase currents are calculated by applying the measured phase voltages to the pre-fault connectivity topology;
        determining a location for each of the simultaneous faults if the simultaneous faults detected are on non-adjacent sections in the distribution network;
        determining locations of the simultaneous faults if the simultaneous faults detected are on adjacent sections in the distribution network; and
        outputting, via the interface, data of a post-fault topology indicating the detected fault sections and locations of the faults in the distribution network.

2. The system of claim 1, wherein the system further comprising:
    a computing device configured to isolate faulted line sections by activating switching operations for connected switches to the faulted line sections that communicatively linked to the distribution system via the communication network.

3. The system of claim 1, wherein each of the primary buses includes a 3-phase current and voltage measurement unit connected to the communication network, wherein the phase current measurement is either a phase injection current injected into the bus from a distributed generation or a load demand, or a phase line current flowed away from the bus through a two-terminal section, wherein the phase voltage measurement is a voltage between the measured phase and a ground; wherein the two-terminal sections can be a transformer, a voltage regulator, a phase shifter, or a line section.

4. The system of claim 1, wherein each of the secondary buses is unconnected with a distributed generation and a load demand, and unconnected with a current and voltage measurement unit, wherein the equivalent measured phase injection currents at the secondary buses are set as zero.

5. The system of claim 1, wherein the phase voltages of a secondary bus are determined as a weighted summation of measured phase voltages at neighboring primary buses, wherein the weight for a neighboring primary bus is determined according to parameters of two-terminal sections between the secondary bus and the neighboring primary bus, wherein the parameters of line sections include series impedances and shunt admittances for the line sections.

6. The system of claim 5, wherein the neighboring primary buses of the secondary bus is determined by executing an all-connected tracing from the secondary bus and stopped at primary buses using the pre-fault connectivity topology.

7. The system of claim 1, wherein the phase voltages of a secondary bus are determined based on measured phase voltages and currents at a neighboring primary bus, wherein the neighboring primary bus is connected to the secondary bus through a path consisting of secondary buses.

8. The system of claim 7, wherein the phase voltages of a secondary bus are determined based on measured phase voltages and currents at one neighboring primary bus of neighboring primary buses that cause minimal number of buses connected to the secondary bus having phase current mismatches between measured values and derived values using the pre-fault topology.

9. The system of claim 1, wherein a line section is determined as a faulted line section if the phase current mismatches at each critical terminal bus of the section are greater than a threshold, wherein the critical terminal bus is defined as the terminal bus of the section that connected with at least one more other two-terminal sections, wherein the phase current mismatch of a terminal bus of the section is determined as a difference between a measured phase injection current at the bus and a derived phase injection current at the bus, wherein the derived phase injection current is determined as a negative summation of derived phase line currents from all two-terminal sections that connected to the bus, wherein the derived phase line currents of each two-terminal section is determined using phase voltages of terminal buses of the two-terminal section and series impedance and shunt admittance of the two-terminal section under the pre-fault topology.

10. The system of claim 1, wherein a line section is determined as a faulted line section if the phase current mismatches at each critical terminal bus of the section are greater than a threshold, wherein the critical terminal bus is defined as the terminal bus of the section that connected with at least one more other two-terminal sections, wherein the phase current mismatch of a terminal bus of the section is determined as a difference between a measured phase line current at the bus and a derived phase line current at the bus, wherein the derived phase line current is determined using phase voltages of terminal buses of the section and series impedance and shunt admittance of the section under the pre-fault topology.

11. The system of claim 1, wherein a location of a faulted line section is determined separately if the faulted line section does not have common terminal bus with all other faulted line sections, wherein the location of the faulted line section is determined as a solution of a quadratic equation of a single variable representing the location of a faulted point along the line section, wherein the coefficients of the quadratic equation are 3-by-1 vectors of complex numbers, and determined based on phase voltages and phase line currents of the section, and series impedance and shunt admittance of the section under the pre-fault topology.

12. The system of claim 11, wherein the quadratic equation of the fault location is formulated by equating phase voltages at the fault point among two sub-sections that formed by dividing the line section from the fault point, wherein each sub-section of the line section is modeled as a $\pi$-model using a series impedance and shunt admittance matrices that varied with the location of the fault.

13. The system of claim 10, wherein the solution of quadratic equation of the fault location is solved using a least square method to minimize the sum of squares of real and imaginary parts of complex residuals for all three phases; wherein complex residual for any phase is determined as the value of the quadratic equation using the row of complex coefficients corresponding to the phase.

14. The system of claim 13, wherein the solution of quadratic equation of the fault location is initialized using a solution to the quadratic equation with real coefficients that set as the real parts, or imaginary parts of complex coefficients corresponding to one specified phase.

15. The system of claim 1, wherein a location of a faulted line section is identified jointly with other fault line sections if the line section shares terminal buses with other faulted line sections; wherein the locations of the faulted line sections are determined as a solution of polynomial equation of multiple variables representing the locations of faulted points along faulted line sections; wherein the coefficients of the polynomial equation are 3-by-1 vectors of complex numbers, and determined based on phase voltages and phase line currents of all faulted sections, phase injection currents of common terminal buses between faulted line sections, and series impedances and shunt admittances of all faulted line sections under the pre-fault topology.

16. The system of claim 15, wherein the polynomial equation of the fault locations is formulated by first equating phase voltages for each faulted line section at the fault point among two sub-sections that formed by dividing the faulted line section from the fault point, and then equating phase voltages at common terminal bus between the faulted line section with other faulted line sections that connected to the common terminal bus; wherein each sub-section of the line section is modeled as a $\pi$-model using a series impedance and shunt admittance matrices that varied with the location of the fault.

17. The system of claim 15, wherein the solution of polynomial equation of the fault locations is solved using a least square method to minimize the sum of squares of real and imaginary parts of complex residuals for all three phases; wherein complex residual for any phase is determined as the value of the polynomial equation using the row of complex coefficients corresponding to the phase.

18. The system of claim 15, wherein the solution of polynomial equation of the fault locations is initialized using a solution to the polynomial equation with real coefficients that set as the real parts, or imaginary parts of complex coefficients corresponding to one specified phase.

19. The system of claim 1, wherein the received signals indicating the measured three-phase voltages and three-phase currents of the measurement units in the distribution network are modified based on predetermined weighted factors stored in the memory.

20. A method for detecting and locating simultaneous faults in a distribution network connected to energy systems of customers for powering the energy systems of the customers, the distribution network having primary and secondary buses connected with two-terminal sections, the method comprising:

receiving measured three-phase voltages and currents from the primary buses via a communication network;

at least one processor, in connection with the memory and the interface, to perform the fault detection program that comprises:

providing series impedances and shunt admittances of each two-terminal sections, and a pre-fault connectivity topology;

determining if simultaneous faults are occurring by verifying at least terminal buses of two line sections having phase current mismatches determined as the differences between the measured values and derived values using pre-fault connectivity topology and phase voltages that are greater than a threshold;

determining a location for each fault individually if the faults are occurring at non-adjacent sections in the distribution network;

determining locations of the faults jointly if the faults are occurring at adjacent sections in the distribution network;

outputting a post-fault topology indicating line sections having faults and locations of the faults; and isolating faulted sections by activating switching operations for connected switches to the faulted sections through a computing device that communicatively linked to distribution system grid via communication network.

* * * * *